United States Patent
Shirasu

(10) Patent No.: US 7,597,606 B2
(45) Date of Patent: Oct. 6, 2009

(54) FABRICATION PROCESS OF SEMICONDUCTOR DEVICE AND POLISHING METHOD

(75) Inventor: Tetsuya Shirasu, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/010,029

(22) Filed: Jan. 18, 2008

(65) Prior Publication Data

US 2008/0146128 A1 Jun. 19, 2008

Related U.S. Application Data

(62) Division of application No. 11/186,808, filed on Jul. 22, 2005, now Pat. No. 7,348,276.

(30) Foreign Application Priority Data

Mar. 30, 2005 (JP) ............................. 2005-099890
May 11, 2005 (JP) ............................. 2005-138705

(51) Int. Cl.
*B24B 49/00* (2006.01)
(52) U.S. Cl. ............... 451/5; 451/10; 451/11; 451/56; 451/72; 451/443
(58) Field of Classification Search ............ 451/5, 451/10, 11, 56, 57, 65, 72, 443; 438/691
See application file for complete search history.

(56) References Cited

U.S. PATENT DOCUMENTS

| 5,961,373 | A * | 10/1999 | Lai et al. ............... 451/41 |
| 6,362,104 | B1 | 3/2002 | Wang et al. |
| 6,435,947 | B2 | 8/2002 | Mueller et al. |
| 6,530,827 | B2 * | 3/2003 | Mitsuhashi ............ 451/72 |
| 6,939,208 | B2 | 9/2005 | Kamimura et al. |
| 6,953,390 | B2 * | 10/2005 | Sakurai et al. ........... 451/56 |
| 6,969,208 | B2 * | 11/2005 | Shinya .................. 401/87 |
| 2001/0030367 | A1 | 10/2001 | Noguchi et al. |
| 2002/0042193 | A1 | 4/2002 | Noguchi et al. |
| 2002/0164932 | A1 * | 11/2002 | Kamimura et al. ....... 451/56 |
| 2003/0003852 | A1 * | 1/2003 | Jeong ................... 451/56 |
| 2004/0242132 | A1 | 12/2004 | Hoshino et al. |

(Continued)

FOREIGN PATENT DOCUMENTS

CN  1306560 A  8/2001

(Continued)

OTHER PUBLICATIONS

Chinese Office Action dated Aug. 24, 2007 issued in corresponding Application No. 200510091424.4.

(Continued)

*Primary Examiner*—Eileen P. Morgan
(74) *Attorney, Agent, or Firm*—Westerman, Hattori, Daniels & Adrian, LLP.

(57) ABSTRACT

A method of fabricating a semiconductor device includes a polishing process of a substrate, wherein the polishing process includes the steps of applying a chemical mechanical polishing process to the substrate on a polishing pad while using slurry, and conditions a surface of the polishing pad, the conditioning step including the step of grinding the surface of said polishing pad by at least first and second conditioning disks of respective, different surface states.

9 Claims, 23 Drawing Sheets

U.S. PATENT DOCUMENTS

2006/0194521 A1* 8/2006 Kamimura et al. ............ 451/56

FOREIGN PATENT DOCUMENTS

| CN | 1494734 A | 5/2004 |
|---|---|---|
| JP | 10-146750 A | 6/1998 |
| JP | 2000-248263 | 9/2000 |
| JP | 2000-252242 | 9/2000 |
| JP | 2000-252243 | 9/2000 |
| JP | 2000-286218 A | 10/2000 |
| JP | 2001-68437 | 3/2001 |
| JP | 2001-127017 | 5/2001 |
| JP | 2002-066905 A | 3/2002 |
| JP | 2003-165048 | 6/2003 |
| JP | 2003-179017 A | 6/2003 |
| JP | 2004-001152 A | 1/2004 |
| JP | 2004-243518 A | 9/2004 |
| JP | 2004-266219 A | 9/2004 |
| JP | 2004-311817 A | 11/2004 |

OTHER PUBLICATIONS

Rohm and Haas (Electronic Materials; Apr. 1, 2003; Press Release).
May et al., Mat. Res. Soc. Symp. Proc. vol. 671 © 2001 Materials Research Society; Polyurethane Pad Degradation and Wear Due to Tungsten and Oxide CMP University of New Mexico, Department of Chemical and Nuclear Engineering & Sandia National Laboratories.
Van Zant (Microchip Fabrication; $3^{rd}$ Edition; McGraw-Hill; 1997).
Dictionary.com; foam; 2006.
Dictionary.com; polyfoam; 2006.
Japanese Office Action dated Oct. 24, 2008 issued in corresponding Japanese Patent Application No. 2005-099890.
Japanese Office Action dated Oct. 28, 2008 issued in corresponding Japanese Patent Application No. 2005-138705.

* cited by examiner

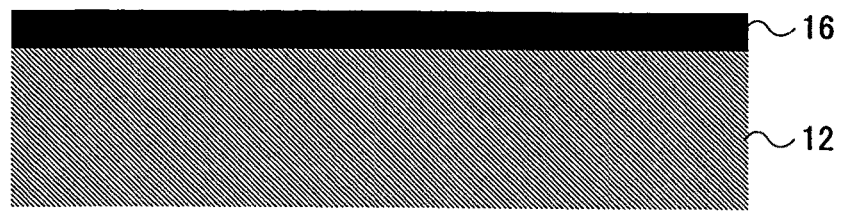
FIG.9A
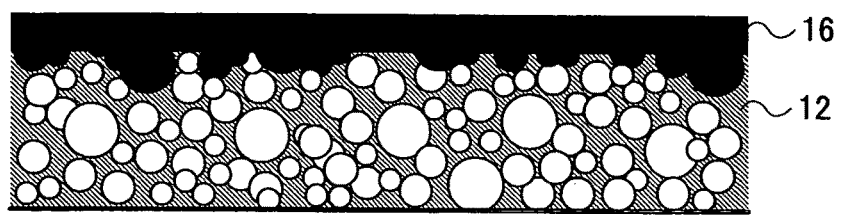
FIG.9B
FIG.10
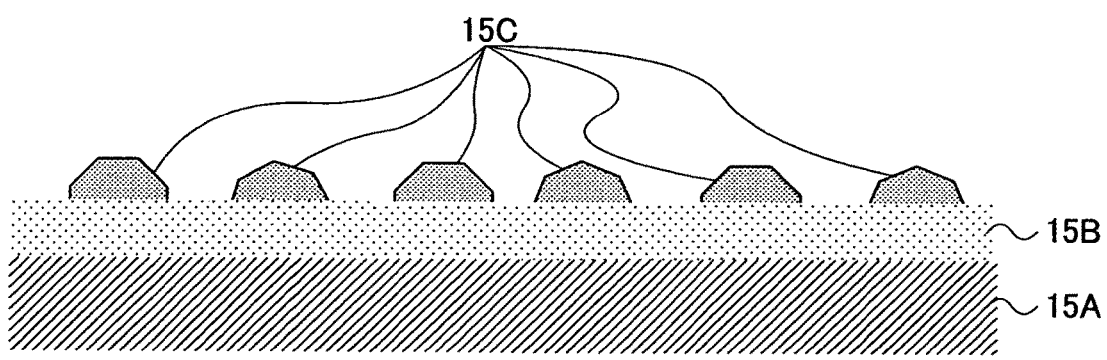

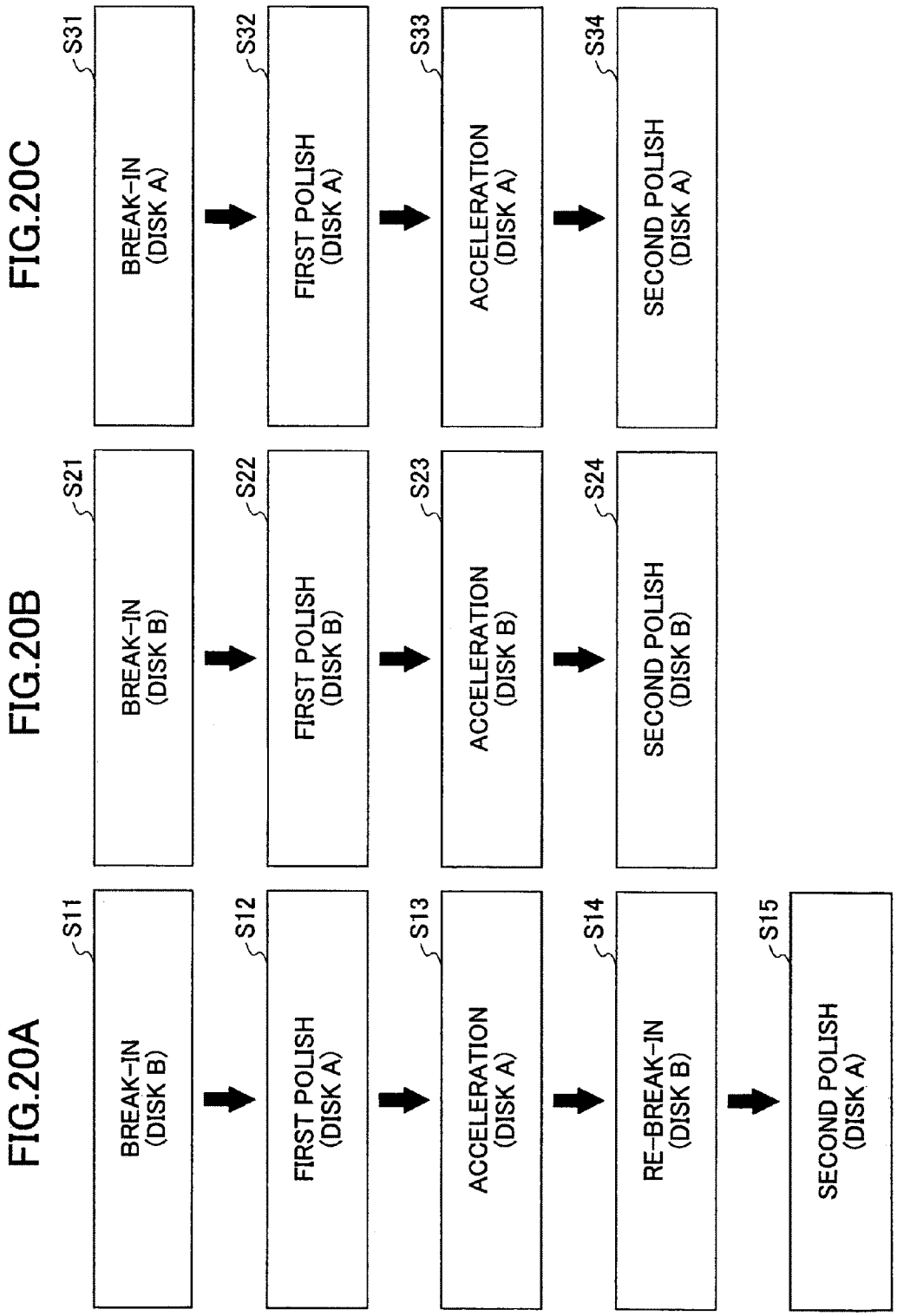

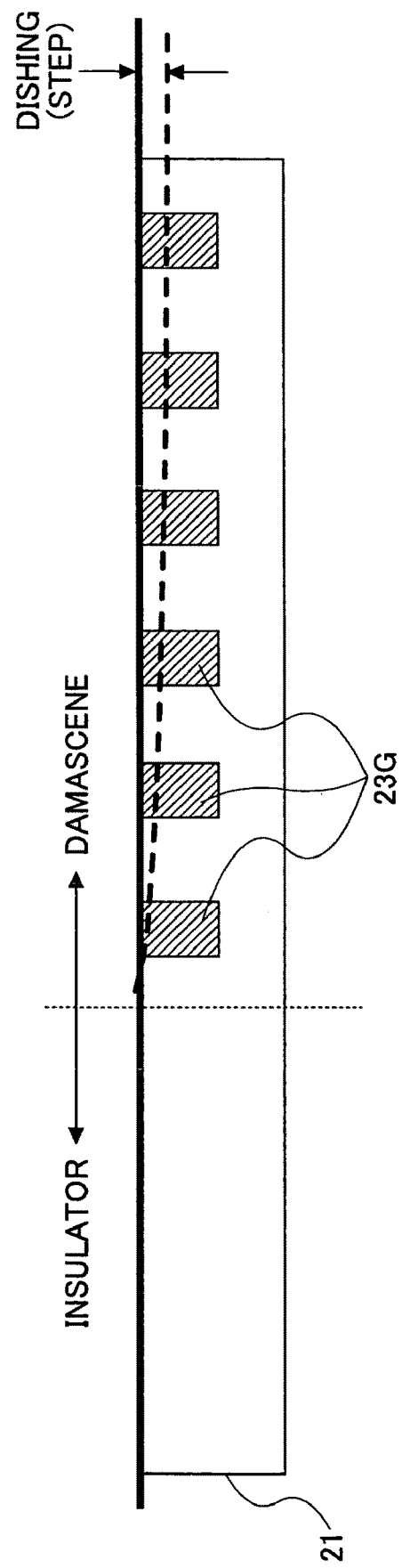

FABRICATION PROCESS OF SEMICONDUCTOR DEVICE AND POLISHING METHOD

CROSS-REFERENCE TO RELATED APPLICATION

This application is a divisional of Ser. No. 11/186,808, filed Jul. 22, 2005, which is based on Japanese priority applications No. 2005-099890 and 2005-138705 filed respectively on Mar. 30, 2005 and May 11, 2005, the entire contents of which are hereby incorporated by reference.

BACKGROUND OF THE INVENTION

The present invention generally relates to the technology of CMP (chemical mechanical polishing) and more particularly to fabrication process of a semiconductor device including a polishing process conducted by CMP technology.

In the production of semiconductor devices, the technology of CMP (Chemical Mechanical Polishing) is extensively used for planarizing a substrate or removing insulation films or conductive films.

Especially, a CMP process is important in the process of forming a multilayer interconnection structure, which uses low-resistance metals such as Cu as an interconnection layer. Further, a CMP process is important not only in surface treatment of silicon wafers and magnetic disks but also in polishing optical elements such as lens.

FIGS. 1A-1E show the fabrication process of a conventional semiconductor device including a Cu damascene process.

Referring to FIG. 1A, an insulation film 21 of $SiO_2$, SiOC, SiC, SiON, SiN, BPSG, and the like, is formed on a semiconductor substrate (not shown) so as to cover an active device such as transistor not illustrated. The insulation film 21 may be formed directly on the semiconductor substrate or on an insulation film formed on the semiconductor substrate.

Next, in the step of FIG. 1B, an interconnection trench 21G corresponding to a desired interconnection is formed in the insulation film 21 by etching. In the case of dual damascene process, a via-hole is formed in the interconnection trench 21G so as to expose the conductive layer lying under the insulation film 21.

Further, in the step of FIG. 1C, the surface of the insulation film 21 is covered with a barrier metal film 22 of tantalum (Ta), titanium (Ti) or nitride thereof (TaN, TiN) including the sidewall surface and bottom surface of the interconnection trench 21G.

Next, in the step of FIG. 1D, a Cu film 23 is formed on the barrier metal film 23 such that the Cu film 23 fills the interconnection trench 21G, wherein such formation of the Cu film 23 is implemented by a sputtering process or plating process, or combination of these.

Further, in the step of FIG. 1E, the Cu film 23 is removed from the surface of the insulation film 21 by using a CMP apparatus together with the barrier metal film 23, and an interconnection structure is obtained such that a Cu pattern 23G is buried in the interconnection trench 21G via the barrier metal film 22.

REFERENCES

Patent Reference 1 Japanese Laid Open Patent Application 2003-165048
Patent Reference 2 Japanese Laid Open Patent Application 2001-127017
Patent Reference 3 Japanese Laid Open Patent Application 2000-248263
Patent Reference 4 Japanese Laid Open Patent Application 2000-252242
Patent Reference 5 Japanese Laid Open Patent Application 2000-252243
Patent Reference 6 Japanese Laid Open Patent Application 2001-68437

SUMMARY OF THE INVENTION

FIG. 2 shows the construction of a typical CMP apparatus 10 used with the process of FIG. 1E.

Referring to FIG. 2, the CMP apparatus 10 includes a platen 11 rotated by a driving source not illustrated, and a polishing pad 12 is fixed upon the platen 11. Further, a semiconductor substrate 14 is held on a carrier 13 rotated by another driving source and is urged to a polishing pad 12 on the platen 11 with a predetermined polishing pressure. Further, slurry 16 is dripped upon the polishing pad 12, and the surface of the semiconductor substrate is polished by chemical mechanical polishing by the slurry held on the polishing pad 12. With such chemical mechanical polishing, insulation films or conductive films on the substrate are polished individually or simultaneously.

With such a CMP apparatus 10, the surface of the polishing pad 12 is subjected to grinding, in other words, "conditioning", for uniform and efficient polishing, by using a conditioning disk 15 on which grinding particles such as diamond or ceramics are fixed and rotated by a different driving source to the driving source rotating the platen 11. Generally, such conditioning of the polishing pad 12 is carried out during the polishing process of the semiconductor wafer or after the polishing has been finished and is called dressing. With such conditioning, the surface of the polishing pad is scraped off and a new pad surface is exposed.

FIG. 3 shows the cross-sectional view of a polishing pad of closed cellular foam structure generally used with conventional a CMP process.

Referring to FIG. 3, the polishing pad of closed cellular foam structure includes mutually independent minute foams 12P called pore having a diameter of several microns to several ten microns on a pad surface and also in the interior, and the slurry is held in a depression 12U formed by such pores at the pad surface. Because the pores are mutually independent, the slurry on the surface of the polishing pad does not penetrate into the interior thereof, and because of this, it is possible to decrease the consumption of slurry as compared with the polishing pad of open cellular structure in which there occurs penetration of slurry penetrates into the polishing pad.

For the slurry, pure water added with a pH adjusting agent is used commonly, wherein abrasive particles are usually admixed further thereto for increasing the polishing rate.

In recent semiconductor devices, Cu is used as a low-resistance interconnection material, and CMP process has now become an indispensable process for forming such a Cu interconnection pattern with a damascene process.

On the other hand, with the polishing pad of such a closed cellular foam structure, there tends to arise the problems that dust formed as a result of polishing or reaction product are left in the foamed structure of the pad and causes clogging at the polishing pad surface. When such clogging occurs, there occurs decrease of polishing rate and polishing becomes unstable. Thereby, uniformity of polishing is deteriorated.

Thus, it has been practiced conventionally to apply a conditioning to the polishing pad surface by using a conditioning disk 15 shown in FIG. 2 each time the polishing pad has been used for a predetermined duration so as to scrape off the polishing pad surface together with processing dust shown in FIG. 4 by a numeral 12X.

Conventionally, a polishing pad of closed cellular foam structure shown in FIG. 4 has been used commonly in the production of miniaturized semiconductor devices, while the polishing pad of this type is based on a foaming body 12P, and thus, it is not possible to avoid occurrence of some variation in the characteristics of the pad originating from the fabrication process of the pad. Such variation of polishing pad may cause various problems in the fabrication of recent ultrafine semiconductor devices such as: variation of the polishing rate; deterioration of uniformity of polishing; increase of polishing time, and the like.

Further, when attempt is made to planarize a stepped structure on a surface with the chemical mechanical polishing process, the flexible foaming body 12P of the polishing pad easily caused deformation according to the shape of the stepped structure to be planarized, and satisfactory planarization is not attained. This problem is particularly serious in the case of polishing a highly miniaturized structure as in the case of semiconductor devices of these days. Further, in the case of polishing a flat structure, there is a possibility, that there appears dishing on the polished surface as a result of flexibility of the polishing pad.

Thus, in view of these various problems, there is proposed recently the use of a polishing pad of foam-free structure shown in FIG. 5.

Referring to FIG. 5, the polishing pad of foam-free structure is formed of a material such as polyurethane or the like, similarly to the conventional polishing pad of open cellular foam structure, except that the polishing pad does not include foam therein.

Because of the foam-free structure, it is possible with the present invention to produce the polishing pad while suppressing the product-to-product variation and the polishing pad of this type has uniform characteristics. Further, because of absence of foams acting as a mechanical buffer part at the time of polishing, the foam-free polishing pad has rigidity larger than that of the foamed polishing pad, and thus, it is possible to effectively planarize a stepped structure on a polished surface when the polishing pad is used to polish a surface carrying such a stepped structure. Further, dishing of the polishing surface is also suppressed, and it is possible to facilitate planarization of the substrate surface with the use of such a foam-free polishing pad.

On the other hand, a foam-free polishing pad does not have the foamed part 12P of FIG. 2, and thus, there is a problem that retention of slurry on the pad is poor with regard to the polishing pad of the foaming structure. Thereby, there is a case that desired polishing rate may not be attained.

FIG. 6 shows the polishing rate for the case of polishing a plasma oxide film formed on a silicon wafer by using a foam-free polishing pad in the CMP apparatus of FIG. 2 in comparison with the case of using a polishing pad of open cellular foam structure. In the experiment of FIG. 6, the polishing was conducted while setting the polishing pressure to 4 psi, the rotational speeds of the polishing carrier 13 and the polishing platen 11 to 90 rpm and 80 rpm, respectively, and supplying a slurry with the flow rate of 200 ml/min.

As can be seen from FIG. 6, there occurs drop of polishing rate of about 16% for the case of using the polishing pad of foam-free structure as compared with the case of using a foamed polishing pad. In the experiment of FIG. 6, there is a relatively high concentration of abrasive particles in the slurry of about 15 wt %, and it is believed that because of this, the magnitude of drop of the polishing rate has been suppressed to the range of about 16% with the case of using a foam-free structure polishing pad. Otherwise, there should be much larger drop of polishing rate.

Meanwhile, in the art of CMP, scratching characteristically occurring with this process has been a large problem. Conventionally, it is known that scratching can be decreased effectively by decreasing the concentration of abrasive particles in the slurry. While scratching can occur by various reasons as in the case in which the abrasive particles dispersed in the slurry cause agglomeration to form a particle of large size, such scratching cause decrease of production yield of semiconductor devices, and control of scratching has been an important object in the CMP technology.

Further, when the concentration of the abrasive particles in the slurry is decreased for decreasing scratching, this would bring forth also decrease of consumption of the abrasive particle, and the production cost of the semiconductor device may be decreased.

However, when the concentration of the abrasive particles is decreased in the CMP process that uses a foam-free polishing pad, there is caused serious decline of the polishing rate.

Further, with the polishing process of Cu such as the one conducted in the step of FIG. 1E, it is generally understood that there is formed a copper oxide on the surface of the Cu layer by the oxidizer contained in the slurry and that the copper oxide thus formed is ground away by the abrasive particles added to the slurry and the polishing pad. Further, it is known the technology of increasing the polishing rate of Cu further by adding an organic acid that forms a complex with Cu to the slurry and dissolving the complex of Cu and the organic acid into the slurry aqueous solution.

Meanwhile, in the technology of CMP, polishing proceeds predominantly in the convex part of the semiconductor substrate surface, which makes contact with the polishing pad and the abrasive particles, and it has been thought ideal that polishing does not occur in the depressed part, to which the polishing pad or abrasive particles do not make contact. Accordingly, it has been expected that a surface having projections and depressions are successfully planarized upon completion of polishing when the polishing is conducted by a CMP process and a surface suitable for semiconductor device production should be obtained.

However, when an organic acid having such an effect of facilitating formation of complex is added to the slurry, there occurs dissolving of Cu or copper oxide also in the depressed part in which the abrasive particle or polishing pad does not make contact, and there are cases in which etching takes place. In this case, erosion proceeds also in the depressed part of the polishing surface, and the polished surface is not planarized completely. Thereby, there occurs formation of depression such as recess or dishing.

Conventionally, attempts have been made to add anticorrosives to the slurry for suppressing the effect of such organic acid, but without success. There is a possibility that this is because the polishing pad, formed of a urethane material having a foaming structure, undergoes flexible deformation with the projections and depressions of the structure to be polished, and there occurs polishing even in the depressed part as a result of contact with the polishing pad. This may be the reason why conventional CMP technology has failed to realize satisfactory planarization.

Further, in conventional CMP process, it is known that polishing rate can be increased by introducing the abrasive particles such as silica into the slurry, and thus, it is in implemented commonly to introduce abrasive particle in to the slurry, while the abrasive particles thus introduced into the slurry tend to agglomerate themselves and form coarse particles. Thereby, there is a tendency that scratching is formed easily on the surface of the object to be processed with such coarse particles. Particularly, an interconnection pattern of Cu formed by a damascene process is soft and easily collects scratching.

It should be noted that such scratching raises a serious problem in the production of highly miniaturized semiconductor devices such as decrease of production yield, and there is a need of taking utmost precaution in the production of ultrafine and ultra high-speed semiconductor devices of severe of design rule to manage the CMP process such that agglomeration of abrasive particle does occur at the time of the CMP process. However, such process management increases the production cost of the semiconductor device.

In a first aspect, the present invention provides a method of fabricating a semiconductor device including the step of polishing a substrate on a polishing pad by a chemical mechanical polishing process, said chemical mechanical polishing process comprising the step of conditioning a surface of said polishing pad by at least first and second conditioning disks of different surface states.

In another aspect, the present invention provides a chemical mechanical polishing method, comprising the steps of:

polishing an object on a polishing pad with a chemical mechanical polishing process; and conditioning a surface of said polishing pad by at least first and second conditioning disks of mutually different surface states.

According to the present invention, it become possible to retain sufficient quantity of slurry on the polishing pad in the case in which it is difficult to secure sufficient polishing rate at the time of chemical mechanical polishing, as in the case of using a polishing pad of foam-free structure or as in the case of using low concentration level for the abrasive particles in the slurry, by conditioning the surface of the polishing pad by using at least first and second conditioning disks of different surface states. Thereby, sufficient polishing rate is secured. Further, by applying the first conditioning disk of large surface roughness to the surface of the polishing pad intermittently, or by using the first conditioning disk and the second the conditioning disk alternately, excessive wear of the polishing pad is avoided, and it becomes possible to extend the lifetime thereof.

According to the present invention, it is possible to realize excellent planarization to the surface of the substrate to be processed by using a foam-free structure polishing pad while securing a sufficient polishing rate.

Further, by decreasing the concentration level of the abrasive particles, it becomes possible to reduce the occurrence of scratching in the surface of the substrate to be processed while securing a sufficient polishing rate.

According to a further aspect, the present invention achieves the above object by using a polishing pad of foam-free structure, and further by using slurry capable of suppressing polishing of a depressed part.

Thus, the present invention provides a method of fabricating a semiconductor device including a polishing process of a substrate, said polishing process of said substrate comprising the step of planarizing projections and depressions of a surface of said substrate by polishing said substrate by a chemical mechanical polishing process on a polishing pad while using a slurry, wherein a polishing pad of foam-free structure is used for said polishing pad, and wherein slurry capable of suppressing polishing of a depressed part is used for said slurry.

In a further aspect, the present invention provides a polishing apparatus, comprising:

one or more polishing platens each rotated and carrying a polishing pad thereon;

a substrate carrier provided in correspondence to each said polishing platen, said substrate carrier holding a substrate to be processed and urging said substrate to said polishing pad while rotating said substrate; and, a slurry supply mechanism supplying slurry to each said polishing pad, at least first and second conditioners cooperating with each said polishing pad, each said conditioner holding a conditioning disk conditioning said polishing pad, each said conditioner urging said conditioning disk to said polishing pad while rotating said conditioning disk.

According to the present invention, elastic modulus or stiffness of the polishing pad is improved by using a polishing pad of foam-free structure, and the surface of the polishing pad no longer deforms substantially according to the structure on the substrate surface at the time of polishing a substrate. Thereby, efficient planarization of substrate surface is achieved.

Especially, by controlling the concentration level of abrasive particles in the slurry to 3 wt % or less, it is possible to eliminate the problem of the depression being polished by abrasive particles invaded to a gap formed between the depressed part of the substrate surface and polishing pad and desired planarization of the substrate surface is impeded.

With a polishing pad of foam-free structure having a flat surface, it is difficult retain slurry thereon as explained before. Thus, with the present invention, the conditioning is applied to the surface of the polishing pad of foam-free structure at least twice, by using conditioning disks of different surface states, such that shallow grooves are formed in the polishing pad surface by using a first conditioning disk at the time of polishing of the substrate, and form deep grooves by using a second conditioning disk every predetermined period. With this, the lifetime of the polishing pad is increased, and it becomes possible to retain the slurry on the surface of the polishing pad of foam-free structure stably. Thereby, it becomes possible to implement the chemical mechanical polishing process stably and effectively.

In order to achieve this object, the present invention provides a polishing apparatuses equipped with at least two conditioners for one polishing platen. By using such a polishing apparatus, it becomes not necessary to exchange the conditioning disks manually, and it becomes possible to implement the above first and second conditioning effectively to the polishing pad of foam-free structure.

Other objects and further features of the present invention will become apparent from the following detailed description when read in conjunction with the attached drawings.

BRIEF DESCRIPTION OF THE DRAWINGS

FIGS. 9A and 9B are diagrams showing the state of slurry held on the polishing pad of foam-free structure and the polishing pad of foaming structure, respectively;

FIG. 10 is a cross-sectional view diagram showing the construction of a general conditioning disk;

FIGS. 20A-20C are flowcharts showing the chemical mechanical polishing process according to a third embodiment of the present invention and a chemical mechanical polishing process according to a comparative example;

FIG. 21 is a diagram explaining the evaluation method of polishing used in the third embodiment of the present invention;

DETAILED DESCRIPTION OF THE INVENTION

Principle

First, the principle of the present invention discovered by the inventor of the present invention in the investigation that constitutes the foundation the present invention will be explained.

Figure 3:
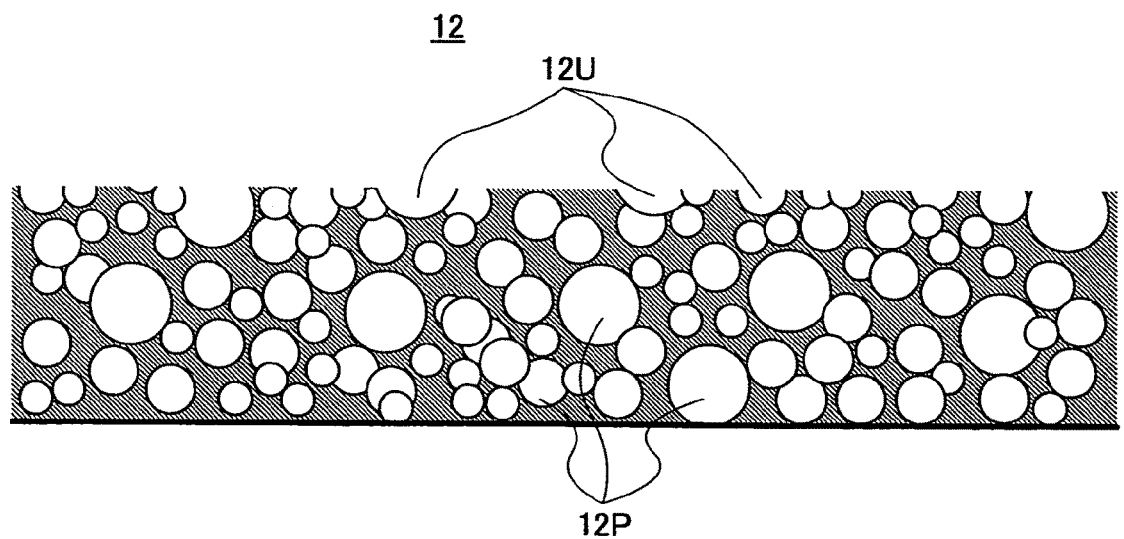
FIG. 3 is a diagram showing the cross-sectional structure of a conventional polishing pad of foaming structure.
Figure 4:
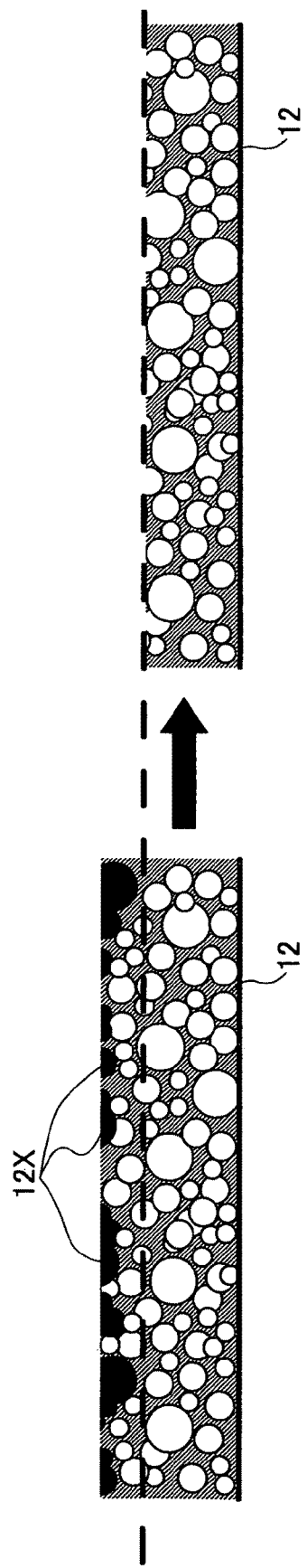
FIG. 4 is a diagram showing the conditioning in a polishing pad of foaming structure.
Figure 7:
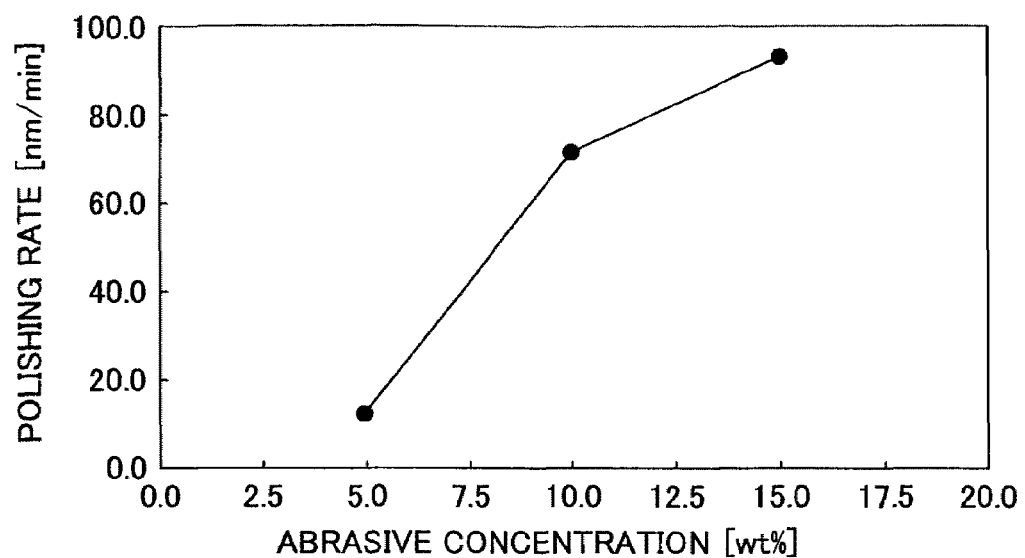
FIG. 7 is a diagram showing the relationship between concentration level of abrasive particles in the slurry and polishing rate.

FIG. 7 shows the relationship between the concentration level of abrasive particles in the slurry and polishing rate for the case of using the polishing pad of foaming structure of FIG. 3.

With this experiment, slurry is prepared by dispersing silica particles in pure water while changing the concentration of the silica particles to 5, 10, and 15 wt %, and the polishing rate of the plasma oxide film formed on a silicon wafer is investigated. Thereby, a CMP apparatus 10 of FIG. 2 was used and polishing was achieved by setting the polishing pressure to 3 psi and rotating the polishing carrier 13 and the polishing platen 11 with respective rotational speeds of 90 rpm and 80 rpm while supplying the foregoing slurry with a flow rate of 200 ml/min.

Referring to FIG. 7, a result was obtained indicating that the polishing rate changes generally in proportion with the concentration level of the abrasive particles. Further, from the result of FIG. 7, it was discovered that the polishing rate falls off sharply, although depending on the diameter of the abrasive particles, when the concentration level of the abrasive particles in the slurry has decreased to 5 wt % or less, From the result of FIG. 7, it is expected that the polishing rate falls off sharply when the concentration level of the abrasive particles in slurry has decreased below a certain level determined by the composition of the slurry or characteristics of the abrasives such as the form or particle diameter of the abrasive particles.

Figure 8:
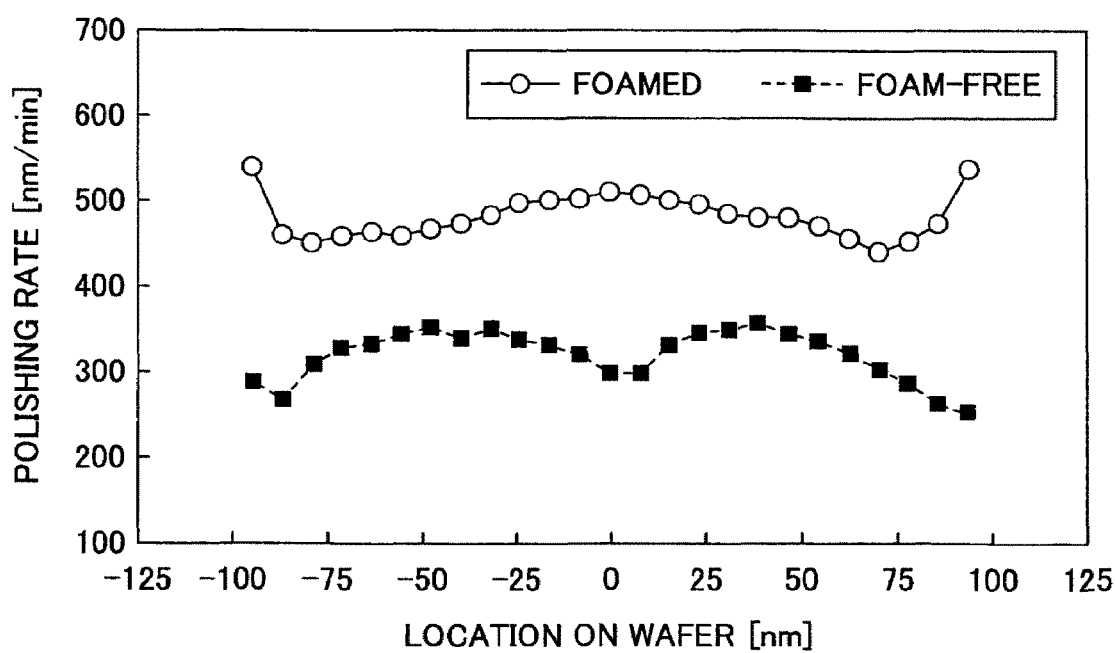
FIG. 8 is a diagram comparing the polishing characteristic between the polishing pad of foaming structure and the polishing pad of foam-free structure.

FIG. 8 shows the result for the case in which a similar experiment has been conducted on the Cu film formed on the silicon substrate via the silicon oxide film.

Referring to FIG. 8, polishing of the Cu film has been conducted in this experiment by setting the polishing pressure to 3 psi, the rotational speed of the polishing carrier 13 to 80 rpm and the rotational speed of polishing platen 11 to 70 rpm, and further by supplying the slurry with the flow rate of 200 ml/min. In the experiment of FIG. 8, the concentration of the abrasive particles in the slurry is set to the 3.5 wt %. In the case of polishing the Cu film, too, the same condition of polishing is applied both to the polishing pad of closed cellular foam structure and the polishing pad of foam-free structure, similarly to the case of polishing an oxide film.

From FIG. 8, it can be seen that the polishing rate attained by using the polishing pad of foam-free structure drops significantly, by the proportion of 33.5%, as compared with the case of using the polishing pad of foaming structure. It is understood that this decrease of polishing rate clearly reflects the low concentration level of the abrasive particles in the slurry.

Like this, there can be caused decrease of polishing rate when a polishing pad of foam-free structure is used or when the concentration of the abrasive particles in the slurry is small, and there is a possibility that it becomes difficult to attain desired high polishing rate.

Figure 2:
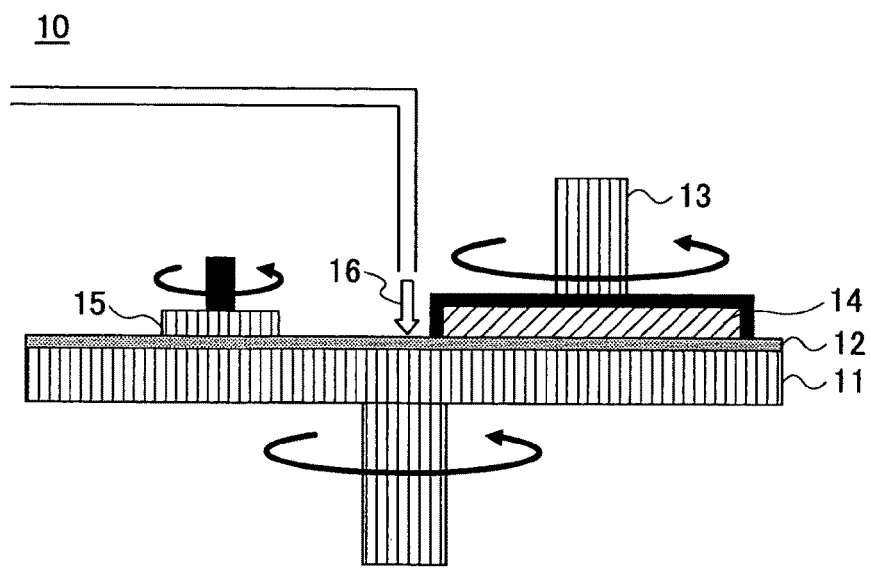
FIG. 2 is a diagram showing the construction of a CMP apparatus used with the present invention.

On the other hand, as the means for solving the problem of decrease of polishing rate occurring in the case of using the polishing pad of foam-free structure or in the case of using the slurry of low concentration level of abrasive particles in combination with the polishing pad of foam-free structure, it is conceivable to form grooves on the surface of the polishing pad by the conditioning disk 15 of FIG. 2.

Figure 6:
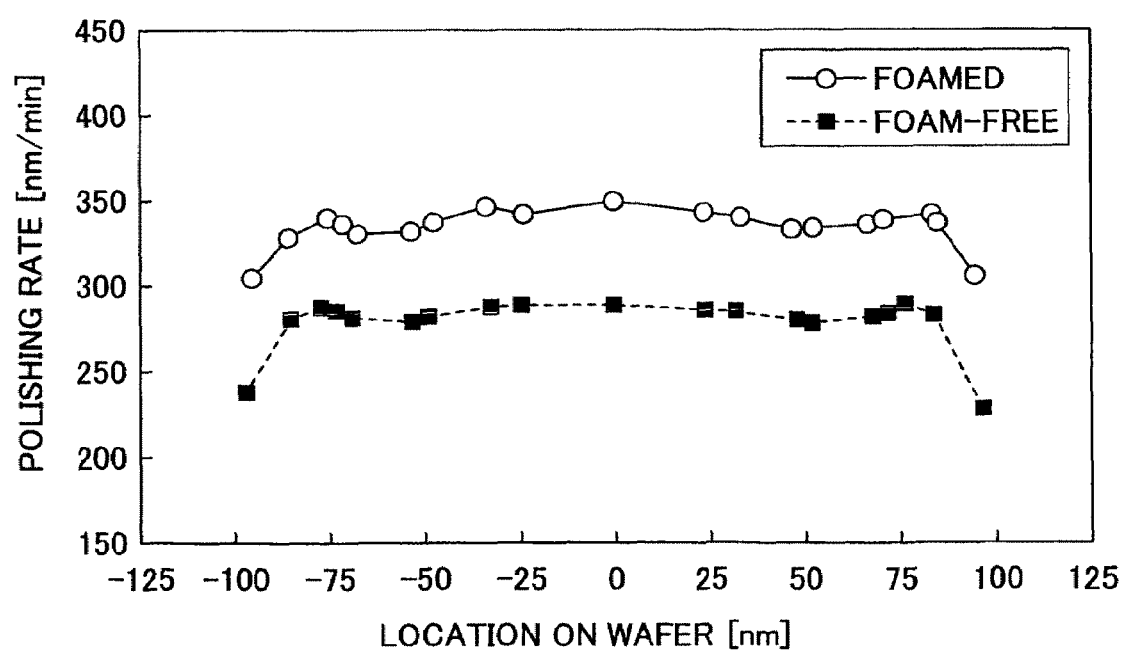
FIG. 6 is a diagram compares the polishing characteristic between the polishing pad of foaming structure and the polishing pad of foam-free structure.

As shown in FIG. 9A, the polishing pad does not have a foaming body (pore) with the polishing pad of foam-free structure, and the quantity of slurry 16 retained on the surface of polishing pad 12 is decreased inevitably as compared with the polishing pad of the foaming structure show in FIG. 9B. Thus, in the case of using a polishing pad of foam-free structure, the quantity of the slurry supplied to the surface of the semiconductor wafer to be polished becomes inevitably smaller as compared with the case of using a polishing pad of foaming structure, and as a result, there occurs a decrease of polishing rate as explained previously with reference to FIG. 6.

Thus, in order to retain the slurry on the polishing pad of foam-free structure similarly to case of the polishing pad of foaming structure, it is conceivable to form minute grooves on the surface of the polishing pad 12 by the conditioning disk 15 and use such grooved polishing pad as an alternative of the foaming body.

FIG. 10 is a drawing showing a cross-section of conditioning disk 15 used conventionally.

Referring to FIG. 10, the conditioning disk 15 is formed of a base 15A and hard grinding particles 15C such as diamond are fixed on the base 15A by an alloy layer 15B. For the base 15A, a stainless steel, or the like, is used generally, and diamond is used for the grinding particles 15C. Further, a Ni alloy is generally used for an alloy layer 15B that holds the grinding particles 15C on the base 15A. Such fixation of the grinding particles 15C on the base 15A can be achieved by forming the alloy layer 15B by electro-deposition process, a plating process or diffusion process.

It should be noted that the characteristics of such a conditioning disk 15 is determined primarily by the hard grinding particles and the arrangement thereof.

Hereinafter, the conditioning disk 15 will be explained for the case of using diamond for the hard grinding particles 15C.

With such a conditioning disk 15, the polishing characteristics of the polishing pad changes extensively with the size and shape of the diamond particles used in the conditioning disk.

For example, in the case the diameter of the diamond grinding particles 15C is small and the diamond particles have a granular or isotropic form, the power of the grinding particles for grinding the polishing pad is decreased, and there occurs decrease in the polishing rate for the polishing pad and also a decrease in the amount of grinding the polishing pad. In such a case, the lifetime of polishing pad 12 is certainly extended; while there can be cases in which it is not possible to achieve sufficient conditioning for the polishing pad.

Conversely, in the case of using diamond particles of irregular form and thus having a sharply pointed shape for the grinding particles 15C, there occurs an increase of polishing rate with the polishing pad 12 thus processed and it becomes possible to achieve satisfactory conditioning for the polishing pad efficiency. On the other hand, there occurs decrease of lifetime for the polishing pad 12, and the production cost of the semiconductor device is increased. Further, such sharply pointed diamond grinding particles easily undergo cracking or chipping, and there is a concern that occurrence of scratching may increase. When scratching is caused, deep scar results on the surface of the semiconductor substrate, and the yield of production of semiconductor devices is decreased inevitably.

It should be noted that there are commercially available products for the conditioning pads of either types, wherein the diamond grinding particles of generally granular form are used more frequently in such commercially available conditioning pads. Thereby, the conditioning disks carrying coarse diamond particles are used according to the situation. By carrying out the conditioning while using the conditioning disk carries coarse diamond grinding particles, it becomes possible to form deeper grooves on the surface of the polishing pad 12 than in the case of using the conditioning disk that carries the diamond grinding particles of granular shape.

Generally, the foaming body used for the polishing pad of foaming structure shown in FIG. 3 has a pore size of several microns to several ten microns. On the other hand, the diamond abrasive particles 15C of FIG. 10 have a size of at least 50 μm, and generally the size of 10 μm to several hundreds microns. Thus, by using such a conditioning disk, it is possible to form deep grooves on the surface of the polishing pad with the depth larger than the pore size of the foaming body.

The conditioning achieved by the conditioning disk 15 of FIG. 10 is similarly effective for the case of conditioning a polishing pad of foam-free structure, and it becomes possible to retain more slurry on the polishing pad surface.

Thus, by using a conditioning disk carrying coarse diamond particles for the conditioning disk 15 in the CMP apparatus of FIG. 2, it is possible to expect increase of polishing rate in any of the case of using the polishing pad of foaming structure explained with FIG. 3 previously for the polishing pad 12 and the case of using the polishing pad of foam-free structure explained with reference to FIG. 5. Thereby, as a result of formation of deep grooves in the polishing pad 12, it becomes possible to retain larger amount of abrasive particles contained in the slurry on the surface of the polishing pad 12 for longer duration.

Figure 11A:
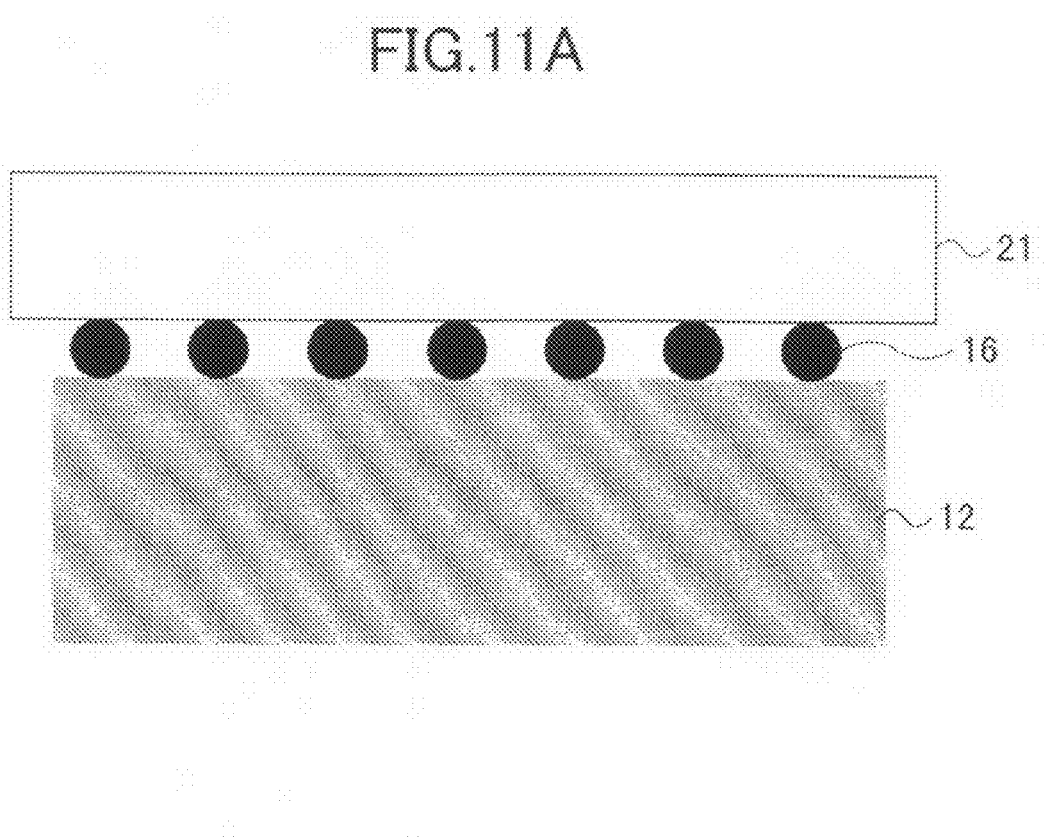
FIGS. 11A and 11B are diagrams schematically showing the polishing of a substrate on polishing pads of different surface states.
Figure 11B:
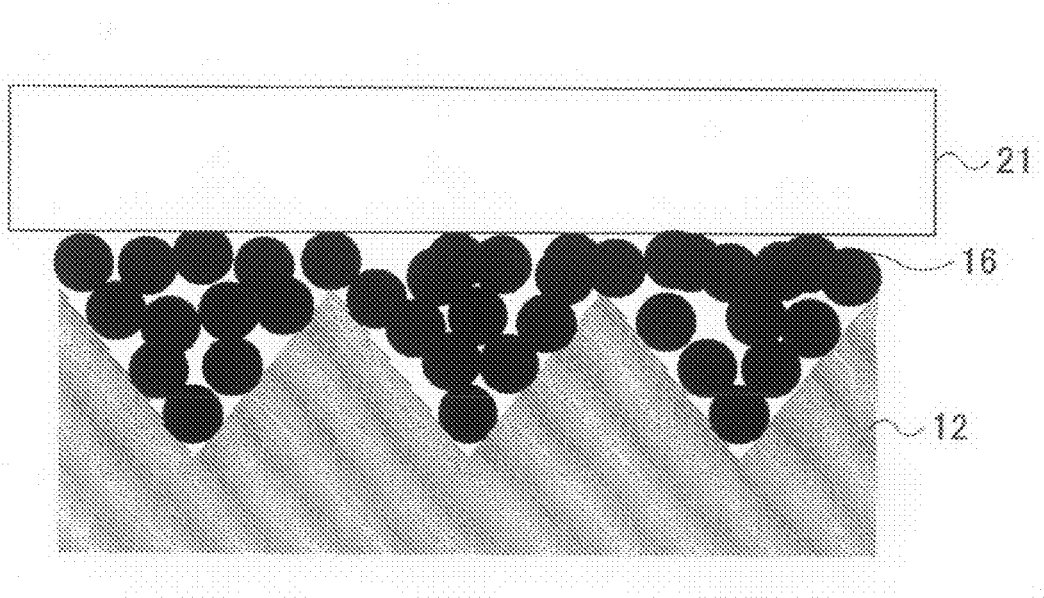

FIG. 11A is a diagram showing the relationship between the semiconductor substrate 21, the abrasive particles in the slurry 16 and the polishing pad 12 for the case of carrying out polishing of the semiconductor substrate 21 in the state of not forming grooves on the surface of the polishing pad 12 of foam-free structure, while FIG. 11B shows the relationship between the semiconductor substrate 21, the abrasive particles in the slurry 16 and the polishing pad 12 for the case of forming deep grooves on the surface of the same polishing pad 12 of foam-free structure by the conditioning disk 15.

Referring to FIG. 11A, it will be noted that the semiconductor substrate 21 makes contact with the surface of the polishing pad 12, to which the slurry is supplied, via the thin layer of the abrasive particle in the slurry 16 in the case the grooves are not formed on the polishing pad 12, wherein the abrasive particles in slurry 16 are gradually crushed and worn out by the pressure and friction with progress of polishing.

Here, there arises no problem as long as fresh abrasive particles are supplied along the surface of the polishing pad 12 for replacement of the worn-out abrasive particles, while control of slurry flow along the surface of the polishing pad 12 is difficult, and there can occur cases in which the abrasive particles are depleted in a particular region of the polishing pad 12. In such a case, there occurs gradual decrease of polishing rate with wearing out of the abrasive particles when the chemical mechanical polishing has been conducted for long time.

On the other hand, in the case the grooves are formed on the surface of the polishing pad by the conditioning disk 15 shown in FIG. 11B, the grooves thus formed retain the abrasive particles in the slurry 16 with large amount, and fresh abrasive particles are replenished on the site even when there occurs wearing out of the abrasive particle during the polishing. Thereby, there is caused no decrease of polishing rate and it becomes possible to carry out chemical mechanical polishing stably over a long time.

Thus, the polishing rate of the semiconductor wafer changes depending on the surface state of the polishing pad 12 used for the chemical mechanical polishing process, while the surface state of the polishing pad 12 is influenced by the surface state of the conditioning disk 15 used for the chemical mechanical polishing. Thereby, the surface state of the polishing pad 12 can be different when the arrangement of the diamond grinding particles 15C thereon is different, even when the conditioning disk is the one that uses the same diamond particles.

FIGS. 12A-12D show some examples of the conditioning disks in which arrangement of the diamond grinding particles 15C thereon is changed, wherein those parts explained previously are designated by the same reference numerals and the description thereof will be omitted.

Figure 12A:
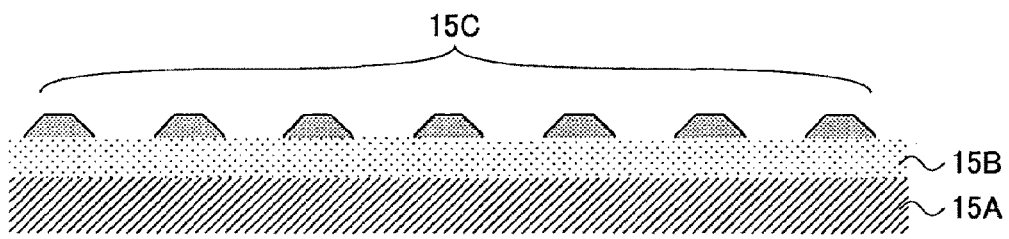
FIGS. 12A and 12D are diagrams showing various conditioning disks.

Referring to FIG. 12A, diamond crystals forming the abrasive particles 15C are oriented in this example such that flat crystal surfaces thereof face in the upward direction. On the other hand, with the example of FIG. 12B, the diamond crystals are oriented such that the corners thereof face in the upward direction. With the construction of FIG. 12B, the corners of the diamond grinding particles 15C face in the upward direction, and it becomes possible to groove the polishing pad more effectively.

Figure 12B:
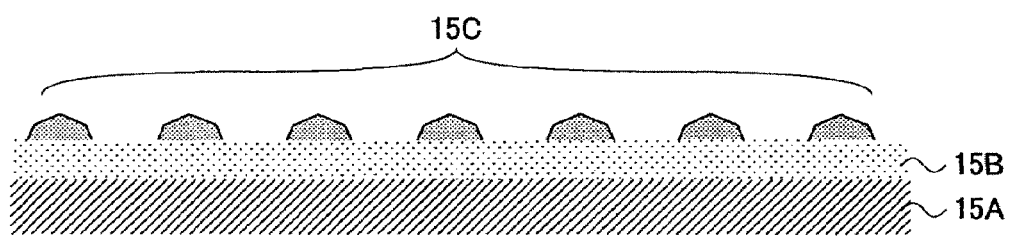
Figure 12C:
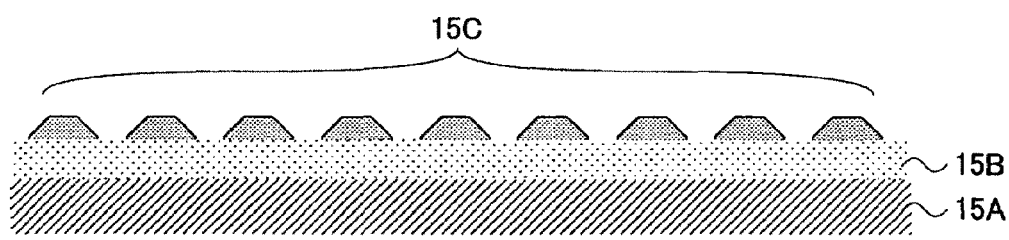
Figure 12D:
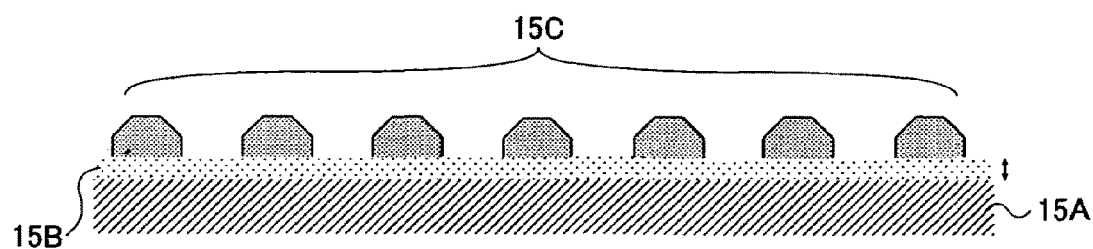

Further, in the example of FIG. 12C, the density of the diamond grinding particles 15C is increased on the conditioning disk 15, while in the example of FIG. 12D, the thickness of the fixing layer 15B holding the diamond grinding particles 15C is decreased for increased exposure of the abrasive particles 15C.

In any of these constructions, it becomes possible to grind the surface of the polishing pad 12 more effectively as compared with the construction of FIG. 12A. Further, with the example of FIGS. 12B and 12D, the depth of the grooves formed on the surface of the polishing pad 12 is increased.

Figure 13A:
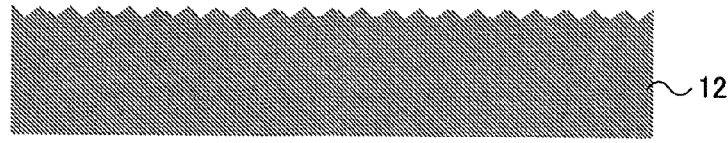
FIGS. 13A and 13B are diagrams showing the surface state of the polishing pads ground with the conditioning disks of different surface states.
Figure 13B:
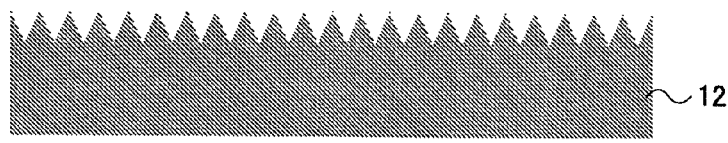

FIG. 13A shows the state of the polishing pad surface schematically for the case of grinding the surface of the polishing pad 12 of foam-free structure by using the conditioning disk of FIG. 12A, while FIG. 13B shows the state of the polishing pad surface schematically for the case of grinding the surface of the polishing pad 12 of foam-free structure by using the conditioning disk of FIG. 12B or FIG. 12D.

From this, it will be noted that the polishing rate for polishing a semiconductor wafer by using a polishing pad that has been conditioned with such a conditioning disk changes according to the arrangement of the diamond grinding particles 15C on the base 15A forming the conditioning disk 15. Further, there can even a case, when comparison is made between a case in which the diamond grinding particles 15C are deposed on the base 15A regularly and a case in which the same diamond grinding particles 15C are disposed random, in that a higher polishing rate is attained for the case of disposing the diamond grinding particles random, in spite of the fact that the same diamond particles are used in these two cases.

With regard to the method of arranging the diamond particles on the conditioning disk, reference should be made for example to Japanese Laid-Open Patent Application 2002-187065.

Figure 14:
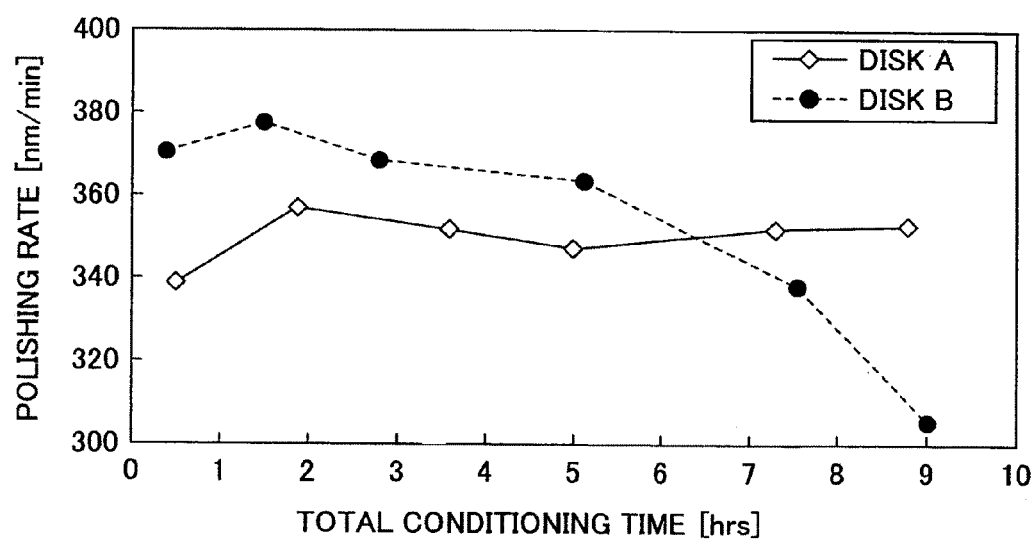
FIG. 14 is a diagram showing the polishing characteristic by a polishing pad ground with different conditioning disks.
Figure 15A:
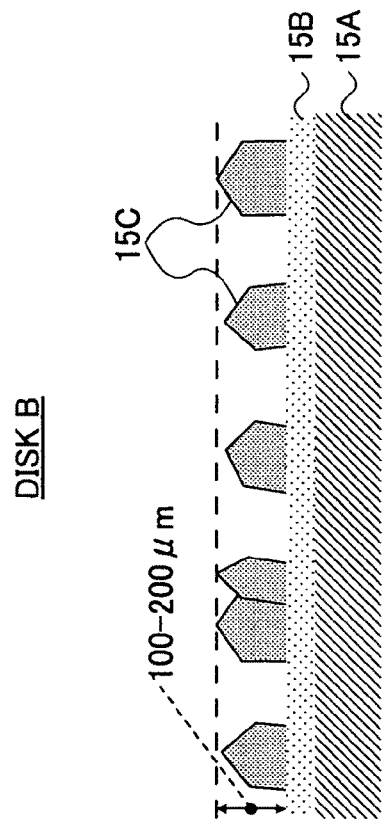
FIGS. 15A and 15B are diagrams showing two different conditioning disks corresponding to FIGS. 13A and 13B.
Figure 15B:
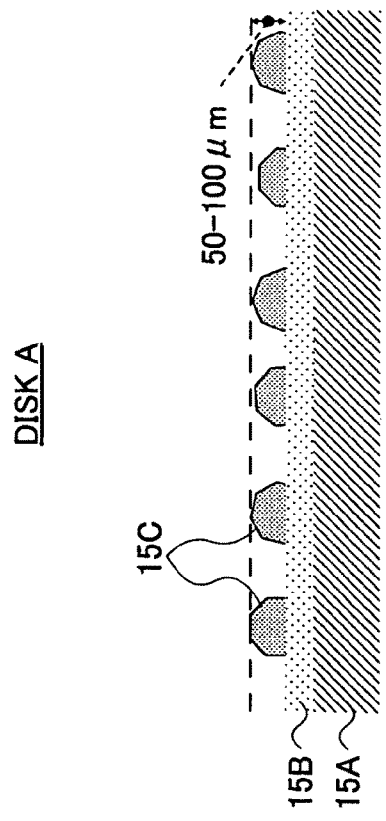

FIG. 14 is a diagram showing the change of polishing rate with time for the case of conditioning a commercially available polishing pad of foaming structure by using two conditioning disks A and B respectively shown in FIGS. 15A and 15B and further conducting polishing of the plasma oxide film with the CMP apparatus of FIG. 2 while using the polishing pad 12 thus conditioned for the polishing pad. In the experiment of FIG. 14, the polishing is conducted by setting the polishing pressure to 4 psi and setting the rotational speed of the polishing carrier 13 and the rotational speed of the polishing platen 11 to 90 rpm and 80 rpm respectively and supplying the slurry with a flow rate of 200 ml min while setting the concentration level of the abrasive particles in the slurry to the 18 wt %. Further, the conditioning of the polishing pad 12 is achieved by setting the pressure of the conditioning disk 15 to 5 psi, wherein the conditioning is applied each time polishing a silicon oxide film.

Referring to FIG. 15A, it should be noted that the conditioning disk A corresponds to the disk of FIG. 12A, and thus, diamond crystals of generally granular shape are used for the grinding particle 15C. Thereby, the grinding particles 15C project from the fixation layer 15B with a distance of 50-100 µm. Contrary to this, the conditioning disk B corresponds to the disk of FIG. 12B or 12D and uses the diamond crystals of coarse and irregular shape for the grinding particles 15C. Thereby, the grinding particles 15 C project by a distance of 100-200 µm from the fixation layer 15B. Thereby, with the conditioning disk B of FIG. 15B, it should be noted that the diamond grinding particles 15C are disposed random on the base 15A, and with this, large grinding speed is realized for the polishing pad 14.

On the other hand, with the conditioning disk A of FIG. 15A, the diamond grinding particles 15C are arranged regularly in the form of a grid.

As a result, in the case of using the polishing pad 12 conditioned with the conditioning disk B, there is increase in the grinding speed of the polishing pad 12 by twice as compared with the case of using the conditioning disk A.

Referring to FIG. 14, the polishing rate immediately after the conditioning is larger in the case of conditioning the polishing pad 12 with conditioning disk B, while it is believed that this has been caused by the situation that there is realized a rougher surface at the polishing pad 12 in the case the disk B was used as compared with the case in which the disk A was used for the conditioning. On the other hand, the slurry contains the abrasive particles with high concentration of about 18 wt %, and it can be seen that the increase of polishing rate is only 10%.

On the other hand, as can be seen in FIG. 14, a phenomenon was discovered in which the polishing rate of silicon oxide film falls off sharply when the total conditioning time has exceeded about 5 hours when the conditioning of the polishing pad 12 has been continued with the conditioning disk B. On the other hand, in the case of using the polishing pad conditioned with the conditioning disk A for the polishing pad 12, it can be seen that a stable polishing rate is obtained even when the total conditioning time has reaches 9 hours.

It is believed that this has been caused because of rapid worn-out of the polishing pad 12. More specifically, because of very large grinding speed of the conditioning disk B, the polishing pad 12 is worn out rapidly with the use of the conditioning disk B and the depth of the grooves formed on the surface of the polishing pad is decreased rapidly. Thereby, it becomes no longer possible to supply the slurry to the semiconductor wafer efficiently.

In the case of using the disk A for the conditioning of the polishing pad 12, there is realized small grinding speed for the polishing pad, and there occurs little wear in the polishing pad even when conditioning is conducted for long time. Thus, the grooves of the polishing pad surface maintain effective depth over a long period of time, and as a result, the supply of the slurry to the semiconductor wafer surface is continued stably, and stable polishing is realized as a result.

Next, similar experiment was conducted by using a Cu film.

With this experiment, a polishing pad of foam-free structure was used for the polishing pad 12, and the polishing was conducted by setting the polishing pressure to 3 psi and rotating the polishing carrier 13 and the polishing platen 11 with respective rotational speeds of 80 rpm and 70 rpm while supplying a slurry containing the abrasive particles with the concentration of the 2 wt % with the flow rate of 200 ml/min. Further, the conditioning of the polishing pad 12 was conducted by using the disks A and B for the conditioning disk 15, wherein the conditioning have been conducted by setting the pressure to 5 psi in any of the cases of using the disk A and the disk B.

Figure 16:
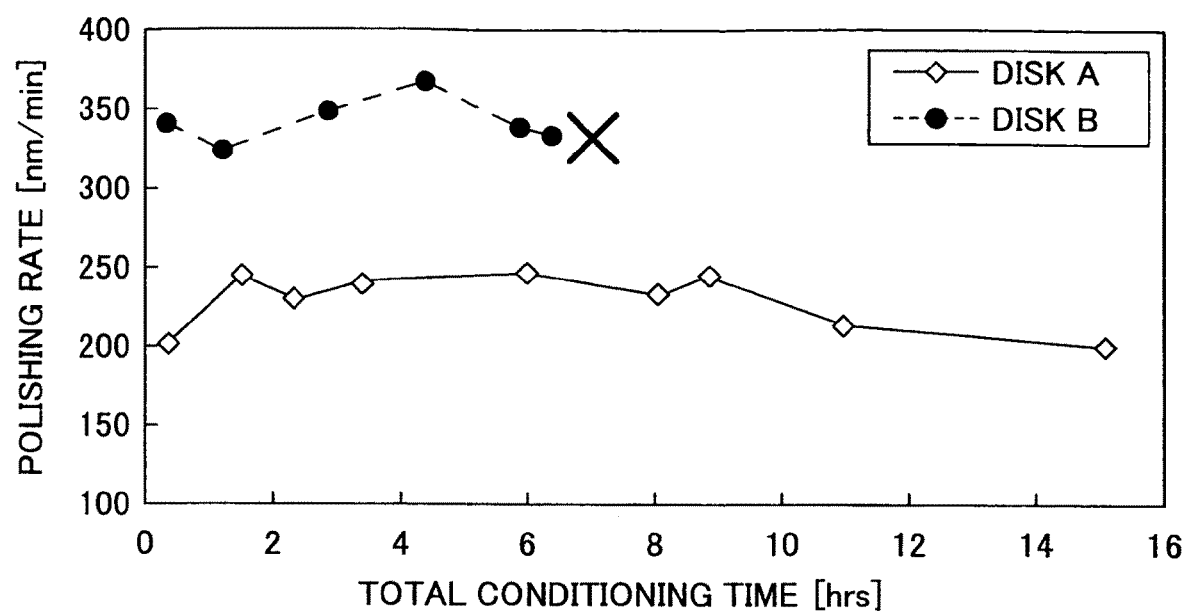
FIG. 16 is a diagram showing the polishing characteristic of the polishing pad ground with two different conditioning disks shown in FIGS. 15A and 15B.

FIG. 16 shows the relationship between the polishing rate and the total conditioning time obtained with this experiment.

Referring to FIG. 16, it can be seen that, in the case the Cu film is polished by using the polishing pad of foam-free structure in combination with the slurry of low abrasive concentration, the effect of the conditioning disk B appears more conspicuously than in the case of polishing an oxide film by using a polishing pad of foaming structure in combination with a slurry containing abrasive particles with high concentration. It can be seen that the polishing rate is increased by about 70% in the maximum.

With this construction, on the other hand, while the polishing rate becomes very large as explained, the lifetime of the polishing pad becomes very short, and it was confirmed that the grooves processed on the polishing pad surface disappear completely when the total conditioning time has exceeded 6 hours. On the other hand, in the case of using the conditioning disk A, the grooves on the polishing pad remain with sufficient depth even when the conditioning has been conducted for about 16 hours. It is estimated that there appears a difference of 4 times or more in the lifetime of the polishing pad 12.

Thus, according to the investigation that constitutes the foundation of the present invention, it was discovered that it is possible to avoid the decrease of polishing rate associated with the use of the slurry of low abrasive concentration or the use of polishing pad of foam-free structure, while it was discovered also that the lifetime of the polishing pad is shortened with the use of the conditioning disk B. Further, it was observed that there occurs degradation in the uniformity of polishing in the semiconductor wafer in the case the conditioning B is used.

Thus, the present invention eliminates the foregoing problems by using two different conditioning processes characterized by two different surface states at the time of conditioning a polishing pad.

First Embodiment

Figure 17:
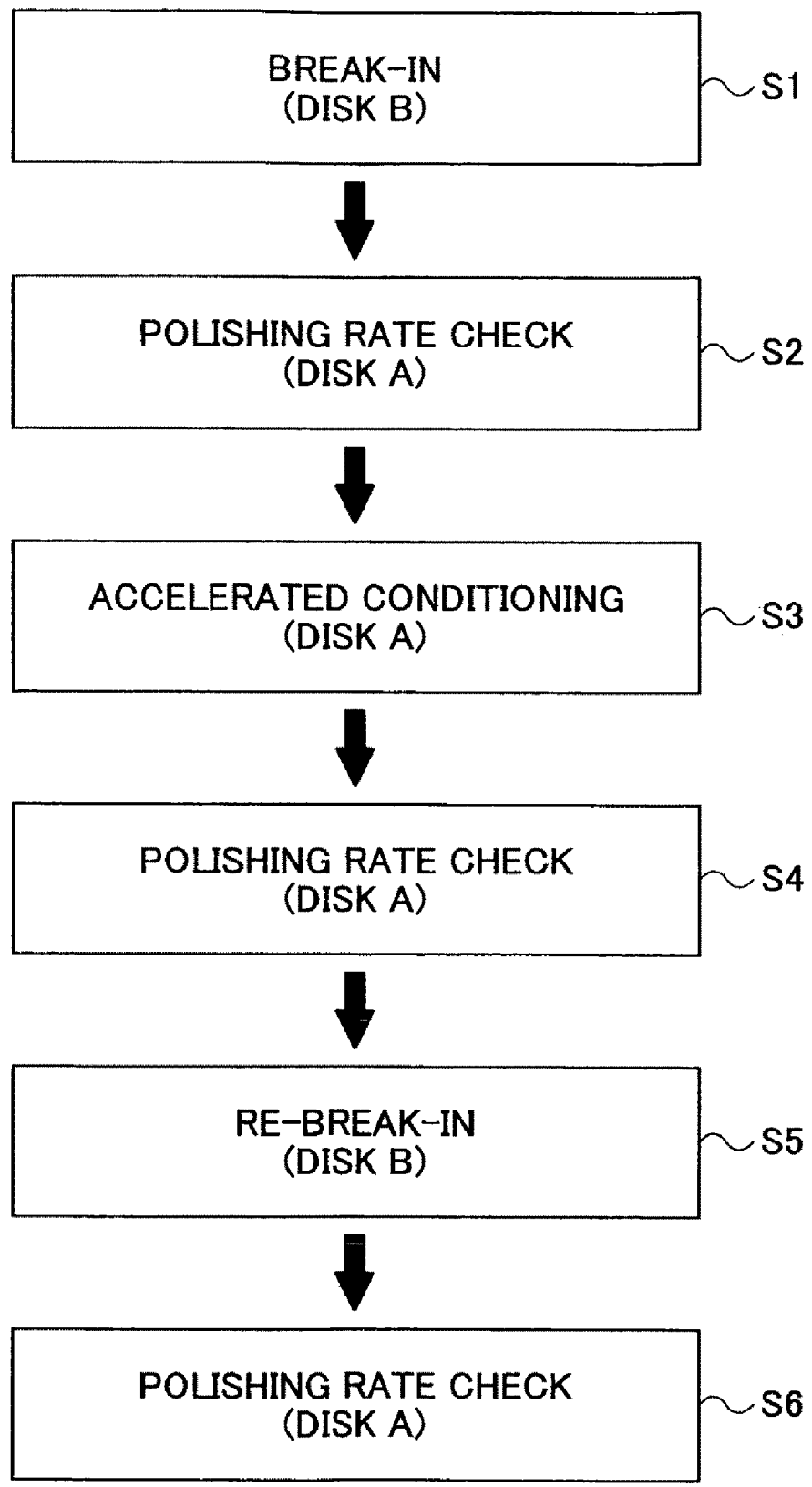
FIG. 17 is a flowchart showing the chemical mechanical polishing process according to a first embodiment of the present invention.

Hereinafter, a first embodiment of the present invention will be explained with reference to FIG. 17 and Table 1, wherein Table 1 represents the condition of the conditioning process while FIG. 17 is a flowchart showing the chemical mechanical polishing according to the first embodiment of the present invention. In the present embodiment, too, the Cu film is polished by using the CMP apparatus 10 of FIG. 2.

TABLE 1

|  | Break-in | Polishing | Acceleration | Re-break-in |
| --- | --- | --- | --- | --- |
| Conditioning disk | B | A | A | B |
| Disk rotation [rpm] | 87 | 87 | 87 | 87 |
| Disk pressure | 9 | 5 | 5 | 9 |
| Conditioning time [sec] | 1800 | 24 | Arbitrary | 600 |
| Platen rotation (rpm) | 70 | 70 | 70 | 70 |

Referring to FIG. 17, a new polishing pad is mounted provided upon the polishing platen 11 as a polishing pad 12, and the conditioning disk B of FIG. 15B explained previously is mounted upon the CMP apparatus 10 as the conditioning disk 15, and break-in of the polishing pad 12 is conducted.

With this step, the polishing platen 11 is rotated with the rotational speed of 70 rpm as shown in Table 1, and the conditioning disk 15, rotated at the rotational speed of 87 rpm, is urged against the polishing pad 12 with an urging force of 9 lbs (pounds). Under this condition, breaking in of the polishing pad 12 is conducted for a period of 1800 seconds. Reference should be made to "break-in" of Table 1.

Next, in the step 2 of FIG. 17, the conditioning disk 15 is changed from the disk B of FIG. 15B to the disk A of FIG. 15A, and polishing of the Cu film is conducted by setting the polishing pressure to 3 psi, the rotational speed of the polishing carrier 13 to 80 rpm and the rotational speed of the polishing platen 11 to 70 rpm, while supplying a slurry of abrasive concentration (concentration of the abrasive particles) of 2 wt % with the flow rate of 200 ml/min. In this step, measurement of the polishing rate is conducted also.

In the step 2, it should be noted that the rotational speed of the conditioning disk 15 is set to 87 rpm and the conditioning of the polishing pad is conducted for the duration of 24 seconds under the conditioning pressure of 51b. Reference should be made to "wafer polishing" in Table 2.

Next, after acquiring the wafer polishing rate in the step 2, accelerated conditioning is conducted in the experiment of FIG. 16 for to gaining the total conditioning time. This accelerated conditioning is conducted by conducting the conditioning for a predetermined time while supplying purified water. Reference should be made to "acceleration" in Table 1.

Further, in the embodiment of FIG. 16, wafer polishing is conducted in the step 4 when a predetermined total conditioning time has been reached as a result of the acceleration in the step 3, and with this, the polishing rate is acquired.

Further, in the step 5, the conditioning disk 15 is changed from the disk A to the disk B with fallen down of the polishing rate, and the breaking-in of the polishing pad 12 is conducted again under the condition of "re-break-in" shown in Table 1 for 600 seconds.

Further, the processing of the step 1-step 5 is repeatedly after the step 6 to FIG. 17, and with this, the data of the polishing rate is acquired.

Figure 18:
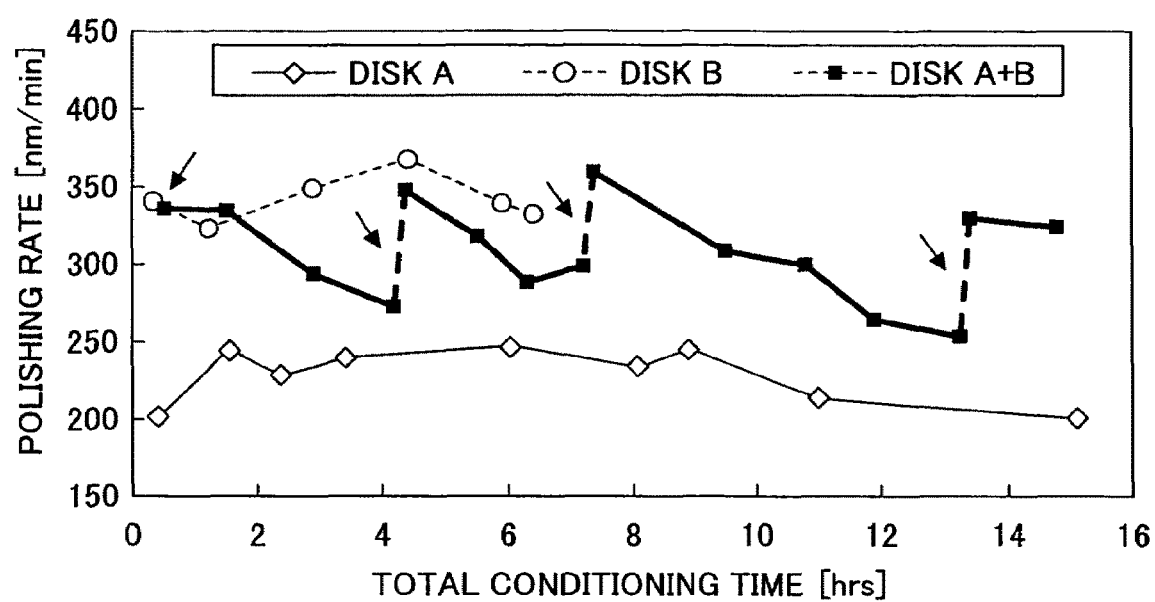
FIG. 18 is a diagram showing the polishing characteristic of a Cu film according to a first embodiment of the present invention.

FIG. 18 shows the polishing rate of the Cu film acquired by the experiment of FIG. 17, wherein "Disk A" represents the polishing rate of the Cu film for the case in which only the disk A is used for the conditioning disk 15, "Disk B" shows the polishing rate of the Cu film for the case in which only the disk B is used for the conditioning disk 15, while "Disk A+B"

shows the polishing rate of the Cu film for the case the disk A and the disk B are used for the conditioning disk 15.

Referring to FIG. 18, with the experiment of "disk A+B", the re-breaking in is achieved with the timing shown by arrow in accordance with the flowchart of FIG. 16, wherein it will be noted that, while high polishing rate is achieved immediately after the breaking in, the polishing rate falls off gradually when the conditioning disk 15 is changed to the disk A and the use of the polishing pad is continued.

Thus, with the experiment of the "disk A+B", the disk B is used for the conditioning disk 15 when the polishing rate has decreased to some extent, the breaking of the polishing pad is conducted again for a predetermined time such that a polishing rate near the initial polishing rate is restored. Further, in the case both of the disk A and the disk B are used for the conditioning disk 15, it was confirmed that a lifetime almost equal to the case in which the conditioning has been conducted only with the disk A is attained for the polishing pad.

Further, in the case the conditioning is conducted only with the disk B, the polishing pad 12 is worn out when the total conditioning time has exceeded about 6 hours. Further, in the case the conditioning is conducted only by using the disk A, only a low polishing rate is obtained.

Thus, by carrying out the conditioning of the polishing pad 12 by combining the disk A and the disk B, it becomes possible to realize a large polishing rate is and long lifetime for the polishing pad.

Further, in the experiment of the flowchart of FIG. 17, in which polishing is conducted by using CMP apparatus 10 of FIG. 2 while changing the disk A and the disk B for the conditioning disk 15, there are CMP apparatuses of the type in which it is possible to mount two or more conditioning disks simultaneously. In such a case, it is possible to implement the polishing process equivalent to the one shown in FIG. 15 without changing the conditioning disks. Further, it is possible to drive two conditioning disks simultaneously and carry out different conditioning processes simultaneously.

Second Embodiment

Next, fabrication process of a semiconductor device including a Cu damascene process will be explained as a second embodiment of the present invention with reference to FIGS. 19A-19E.

Figure 19A:
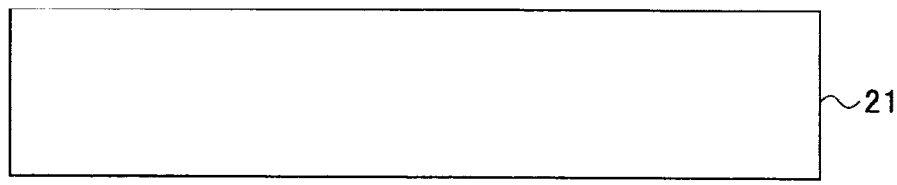
FIG. 19A-19E are diagrams showing the fabrication process of a semiconductor device according to a second embodiment of the present invention.

Referring to FIG. 19A, an insulation film 21 of $SiO_2$, SiOC, SiC, SiON, SiN, BPSG, and the like, is formed on a semiconductor substrate (not shown) so as to cover active devices such as a transistor formed on the semiconductor substrate. The insulation film 21 may be formed directly on the semiconductor substrate or on an insulation film formed on the semiconductor substrate.

Figure 19B:
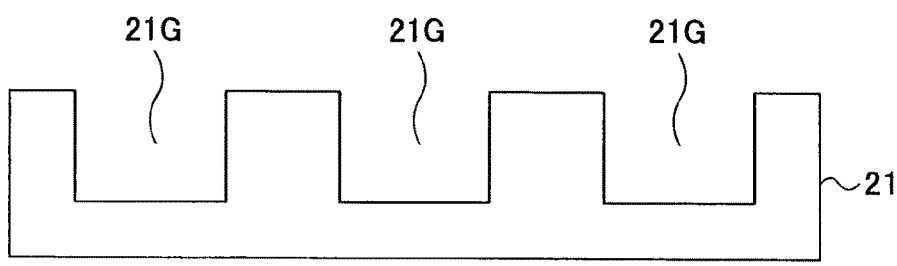
Figure 19C:
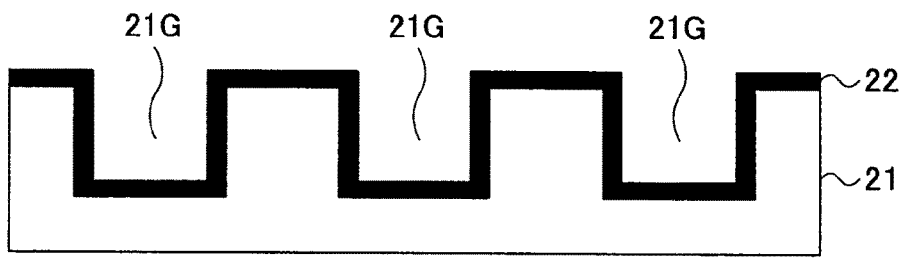

Next, in the step of FIG. 19B, an interconnection trench 21G corresponding to a desired interconnection pattern is formed in the insulation film 21 by an etching process. In the case of dual damascene process, via-holes are formed in the interconnection trench 21G so as to expose the conductive layer underneath the insulation film 21. Further, in the step of FIG. 19C, the surface of the insulation film 21 is covered with a barrier metal film 22 of tantalum (Ta), titanium (Ti) or nitride thereof (TaN, TiN) so as to include the sidewall surface and the bottom surface of the interconnection trench 21G.

Figure 19D:
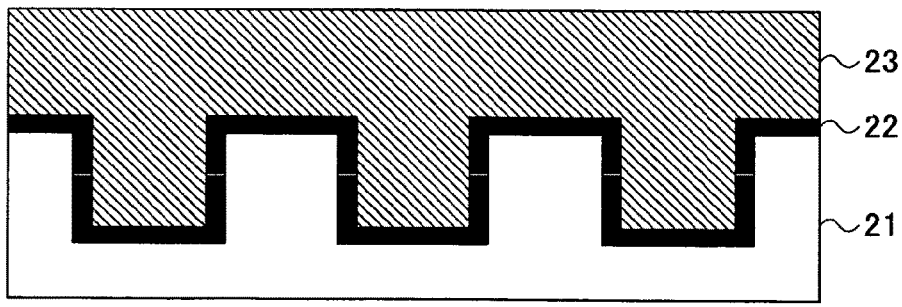

Next, in the step of FIG. 19D, a Cu film 23 is formed on the barrier metal film 23 so as to fill the interconnection trench 21G. It should be noted that formation of such a Cu film 23 is implemented by a sputtering process or plating process, or by a combination thereof.

Figure 19E:
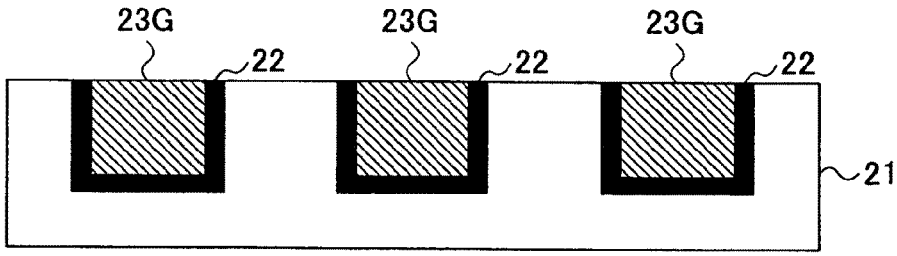

Further, in the step of FIG. 19E, the Cu film 23 is removed from the surface of the insulation film 21 together with the barrier metal film 23 by using the CMP apparatus 10 of FIG. 2, and an interconnection structure is obtained such that a Cu pattern 23G is buried in the interconnection trench 21G via the barrier metal film 22.

With the present embodiment, the CMP process of FIG. 19E is conducted by using a polishing pad of foam-free structure together with slurry in which colloidal silica is dispersed in a solvent as abrasive particles with the concentration of the 1.5 wt %. For the solvent, a mixture in which an organic acid forming a complex with Cu, an oxidizer oxidizing Cu, and an anticorrosive forming a protective film on a Cu surface are added to ultra-pure water, or a mixture in which hydrogen peroxide and an organic acid are added to ultra-pure water may be used.

Further, in the case of carrying out the break-in of the polishing pad 12, the present embodiment uses the disk B of FIG. 15B for the conditioning disk 15, while the disk A of FIG. 15A is used for the conditioning disk 15 at the time of usual polishing.

Third Embodiment

FIG. 20A is a flowchart showing the experiment corresponding to a third embodiment of the present invention.

Referring to FIG. 20A, a polishing pad of foam-free structure is mounted upon the CMP apparatus 10 of FIG. 2 as the polishing pad 12 in the step 11 of the present embodiment, and break-in of the polishing pad 12 is carried out by using the disk B of FIG. 15B for the conditioning disk 15, under the condition "break-in" in Table 1 explained previously.

Next, step 12, the disk A of FIG. 15A is used for the conditioning disk 15, and polishing of the Cu film 23 of the FIG. 19E is carried out while conducting conditioning of the polishing pad 12 under the polishing condition explained before (Polishing pressure=3 psi; carrier rotational speed=80 rpm; Platen rotational speed=70 rpm; Slurry flow rate=200 ml/min). Further, the conditioning of the polishing pad 12 is carried out under the condition of Table 1 ("wafer polishing").

Further, in the step 13, accelerated conditioning of the polishing pad 12 is carried out while using the disk A as the conditioning disk 15 under the condition of Table 1 ("acceleration"), and in the step 14, re-breaking in of the polishing pad 12 is carried out under the condition of Table 1 ("re-break-in").

Further, in the step 15, polishing of the Cu film 23 is conducted under the same condition as in the case of the step 12.

With the present embodiment, a comparative experiment was conducted for the process of FIG. 20B and the process of FIG. 20C for the purpose of evaluating the effect of the process of FIG. 20A.

In the experiment of FIG. 20B, a polishing pad of foam-free structure is used together with the disk B, and similar polishing process was carried out except that the step 14 (re-break-in) of FIG. 20A is omitted.

Thus, with the step 21, a break-in similar to that of the step 11 is conducted, and polishing of the Cu film 23 similar to the step 12 is conducted in the step 22 in the state of mounting the disk B for the conditioning disk 15.

Further, in the step 23, acceleration conditioning is carried out according to the condition of Table 1 in the state of mounting the disk B as the conditioning disk 15. Further, in the step 24, the step 14 of FIG. 20A is skipped, and polishing of the Cu film 13 is conducted in correspondence to the step 15 under the same condition as the step 22.

Further, in the experiment of FIG. 20C, similar polishing was conducted while using a polishing pad of foaming structure in combination with the disk A except that the step 14 (re-break-in) of FIG. 20A is omitted.

Thus, in the step 31, a break-in similar to that of the step 11 is carried out while using disk A as conditioning disk 15, and in the step 32, polishing of the Cu film 23 similar to the step 12 is conducted in the state that the disk A is mounted as the conditioning disk 15.

Further, in the step 33, while maintaining the state in which the disk A is mounted as the conditioning disk 15, there is conducted accelerated conditioning according to the condition of Table 1. Further, in the step 34, the step 14 of FIG. 20A is skipped, and polishing of the Cu film 23 is conducted in correspondence to the step 15, under the same condition as the step 32.

FIG. 21 shows the method of evaluation of the damascene structure thus polished.

In a Cu damascene structure processed with a CMP process, there is a tendency that a difference of level called dishing is formed in the region where damascene interconnection patterns are formed because of larger polishing rate of a Cu as compared with the polishing rate of the insulation film constituting the interlayer insulation film. On the other hand, in order to realize high reliability of semiconductor devices, it is desirable to suppress formation of such dishing as much as possible.

Thus, with the present embodiment, evaluation of polishing process of FIGS. 20A-20C is achieved by measuring the difference of level between the region in which the interconnection patterns are not formed and the region in which the damascene interconnection patterns are formed as shown in FIG. 21. Thereby, it should be noted that the measurement is conducted at the central part and peripheral part of the substrate.

Figure 22:
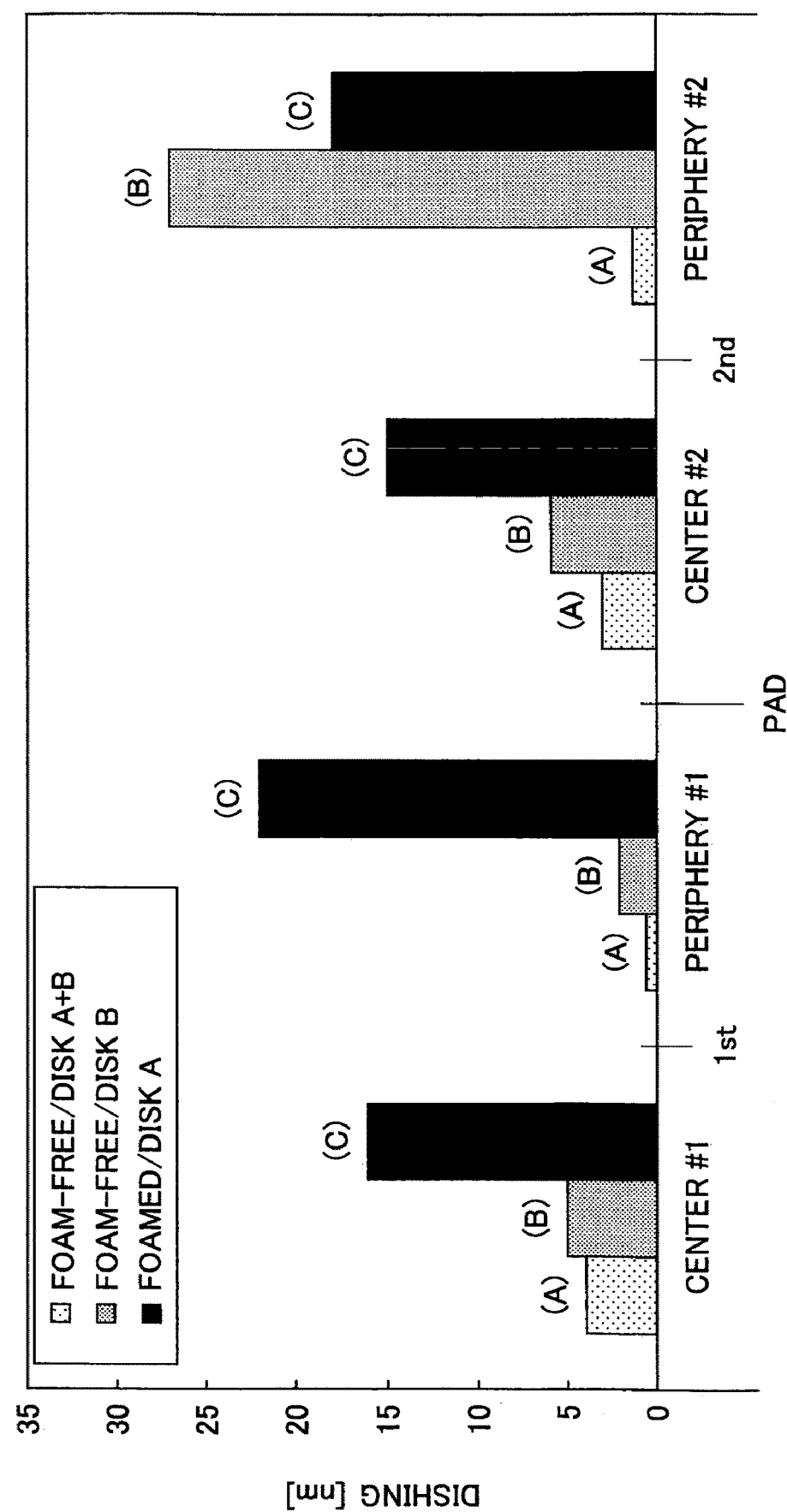
FIG. 22 is a diagram showing the evaluation result of polishing in the third embodiment of the present invention.

FIG. 22 shows the result of the foregoing measurement.

Referring to FIG. 22, it should be noted that (A) corresponds to the process of FIG. 20A and hence the process of the present embodiment, wherein it can be seen that the measured difference of level is very small and that there occurs no increase of the level difference even after the accelerated conditioning.

On the contrary, (B) in FIG. 22 corresponds to the case of FIG. 20B in which only the disk B is used with the polishing pad of foam-free structure, wherein it will be noted that the level difference resulting with the first polishing process of the step 22 is small and good result is obtained, while in the case acceleration conditioning is conducted thereafter in the step 23, it can be seen that there occurs a significant increase of level difference particularly at the peripheral part of the semiconductor substrate. It is believed that this has been caused because the polishing pad 12 is worn out in the peripheral part thereof to which a peripheral part of the semiconductor substrate makes contact, and that the grooves have been almost eliminated as a result.

It is believed that this reflects the situation in which, because of large grinding rate of the polishing pad with the use of the disk B, the grooves on the polishing pad disappear in a short time period, and with this, the slurry is no longer supplied to the polishing pad surface sufficiently, and resultant degradation of polishing performance.

On the other hand, (C) of FIG. 22 indicates the case in which the polishing pad of foaming structure is combined with the disk A, wherein it will be noted that there no large difference between the step 32 and the step 34, and polishing itself is stabilized as compared with the process of FIG. 20B. However, it can be seen that the level difference has increased considerably as compared with the process of FIG. 20A.

Thus, by using the disk B for the conditioning disk 15 at the time of break-in of the polishing pad and by using the disk A at the time of ordinary polishing, it becomes possible with the present embodiment to realize a large and stable polishing rate while using a rigid polishing pad of foam-free structure and while using the slurry of low concentration of the abrasive particles, without shortening the lifetime of the polishing pad. Thereby, it becomes possible to realize a chemical mechanical polishing process in which formation of dishing is suppressed and occurrence of scratching is also suppressed.

With the present invention, the insulation film 21 may be any of Si, SiO, $SiO_2$, SiOC, SiC, SiON, SiN, BPSG and a composite film thereof. Further, in place of the Cu film 23, it is possible to use a film of W, Ti, Al, Ta, Ag, Au, Pt, Ru, polysilicon, amorphous silicon, or oxide or nitride thereof.

Further, while the chemical mechanical polishing process has been explained in relation to the formation of the damascene structure with the foregoing description, the present invention is limited to this, and it is possible to apply the present invention to formation of STI (shallow trench isolation) structure, or the like.

Fourth Embodiment

Figure 5:
FIG. 5 is a diagram showing the cross-sectional structure of a polishing pad of foam-free structure.

With a fourth embodiment of the present invention, experiment of forming a Cu pattern by a damascene process has been conducted by using a polishing pad of foam-free structure of FIG. 5 in the CMP apparatus 10 of FIG. 2.

Figure 1A:
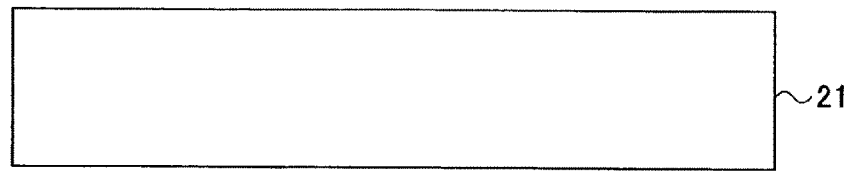
FIGS. 1A-1E are diagrams showing an example of fabrication process of a semiconductor device by a damascene process.

This experiment has been conducted by a process similar to that of FIGS. 1A-1E explained previously, and thus, the oxide film 21 was formed on the silicon substrate with the thickness of 500 nm with a step corresponding to that of FIG. 1A.

Figure 1B:
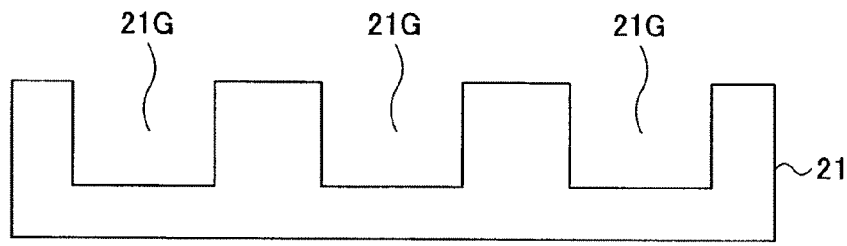
Figure 1C:
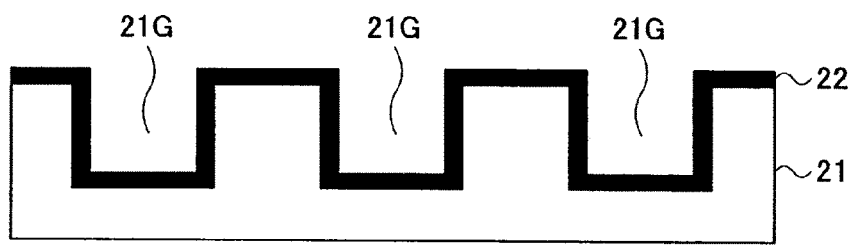
Figure 1D:
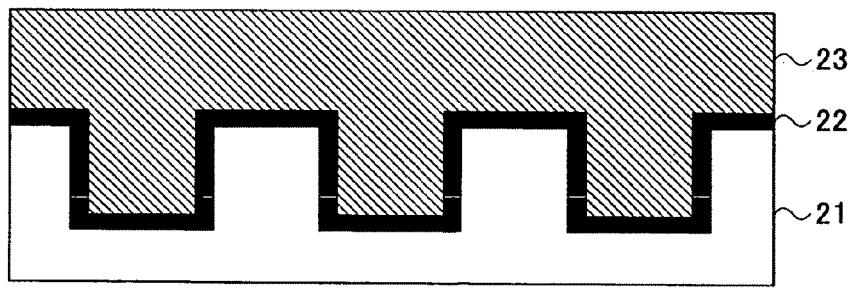

Further, with a step corresponding to that of FIG. 1B, the interconnection trenches 21G were formed with a width of the 0.9 µm and a pitch of 0.15 µm, and the barrier metal film 22 was formed in a step corresponding to the step of FIG. 1C with a thickness of 10 nm. Further, in a step corresponding to the step of FIG. 1D, the Cu layer 23 was depositing with the thickness of 1000 nm.

Figure 1E:
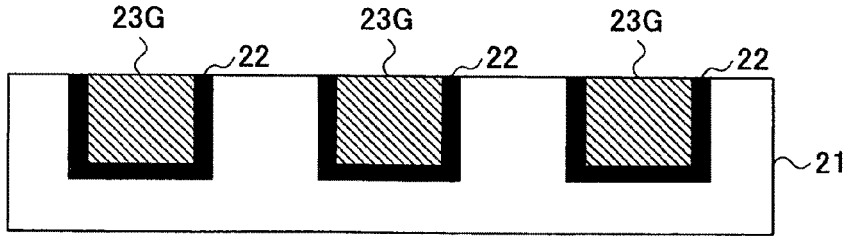

Further, with a step corresponding to the step of FIG. 1E, the Cu layer 23 was polished by using the polishing pad of foam-free structure. Thereby, the duration of polishing of the Cu layer 23 is determined based on a specimen specifically manufactured for polishing rate measurement.

More specifically, the specimen was prepared by forming an oxide film on a silicon substrate with a thickness of 100 nm, forming a barrier metal film on the oxide film with a thickness of 10 nm, without patterning the oxide film, and depositing a Cu film further thereon with a thickness of 10000 nm. Further, the polishing time is determined by obtaining the time needed for polishing the Cu layer on this specimen for the depth of 650 nm and 950 nm, and the polishing of the foregoing Cu layer 23 in the step corresponding to the step of FIG. 1E has been conducted with the duration thus obtained.

Further, in order to confirm the effect of the present invention, a specimen for comparative test was formed by conducting similar polishing while using the polishing pad of foaming structure (IC-1000 of Nitta Haas Incorporated) for the polishing pad 12 in the CMP apparatus 10 of the FIG. 2.

Table 2 below shows the composition of the slurry used for the polishing while Table 3 shows the polishing condition.

TABLE 2

| | |
|---|---|
| Oxidizer | Hydrogen peroxide 10.0% |
| Anticorrosive | BTA(benzotriazole) 0.2% |
| Substance dissolving Metal or metal oxide | Malic acid 0.2% |
| Surfactant | Water-soluble polymer 0.1% |
| Abrasive particles | Colloidal silica of 50 nm diameter |
| Purified water | 88.5% |

TABLE 3

| | |
|---|---|
| Polishing pressure | 3 psi |
| Carrier rotational speed | 75 rpm |
| Platen rotational speed | 65 rpm |
| Slurry supply rate | 200 ml/min |

Referring to Table 2, the slurry used in the experiment is the one prepared for polishing a metal film and contains hydrogen peroxide for the oxidizer, BTA (benzotriazole) for the anticorrosive, malic acid as the substance dissolving metal or metal oxide, and a water-soluble polymer as a surfactant, in addition to purified water. Further, the slurry contains small amount of abrasive particles of colloidal silica.

In the case such a polishing pad of foam-free structure is used, it is difficult to retain the slurry stably on the polishing, and because of this, the present embodiment uses two conditioning disks of different surface roughness for the conditioning disk 15 in the CMP apparatus 10 of FIG. 2, such that a coarse conditioning disk is used at first to form deep grooves on the surface of the polishing pad at first as shown in FIG. 13B and thereafter use a fine conditioning disk to carry out polishing while forming shallow grooves on the polishing pad surface as shown in FIG. 13A.

Further, when the conditioning with the fine conditioning disk has reached a predetermined time period, conditioning with the coarse conditioning disk is conducted again, and thereafter, the conditioning with the fine conditioning disk is continues. Thereby, polishing of the Cu layer 23 is continued while the conditioning by using the coarse conditioning disk is carried out.

According to such a method, deep grooves capable of retaining the slurry stably are formed on the surface of the polishing pad of foam-free structure by conducting conditioning by using the coarse conditioning disk, while the polishing dust formed as a result of polishing of the Cu layer 23 is removed by the conditioning by the fine conditioning disk during the process of polishing. Further, in the case of using the coarse conditioning disk alone, there occurs rapid wear in the polishing pad, while by using such a coarse conditioning disk intermittently, it is possible to secure the lifetime of the polishing pad.

Figure 23:
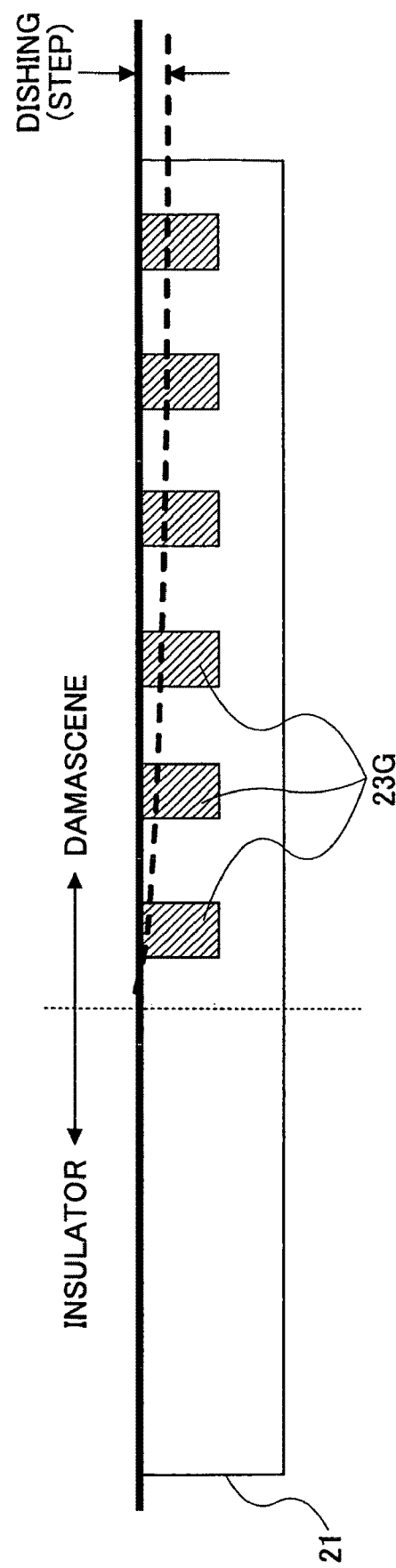
FIG. 23 is a diagram explaining the evaluation method of polishing used in the fourth embodiment present invention.

FIG. 23 shows the outline of the damascene structure obtained according to such a process.

Referring to FIG. 23, the damascene structure thus obtained has a form similar to the one shown in FIG. 21, wherein the difference of level thus formed as a result of polishing was measured with the present embodiment and compared with the case in which the polishing pad of foaming structure of FIG. 3 has been used.

Figure 24:
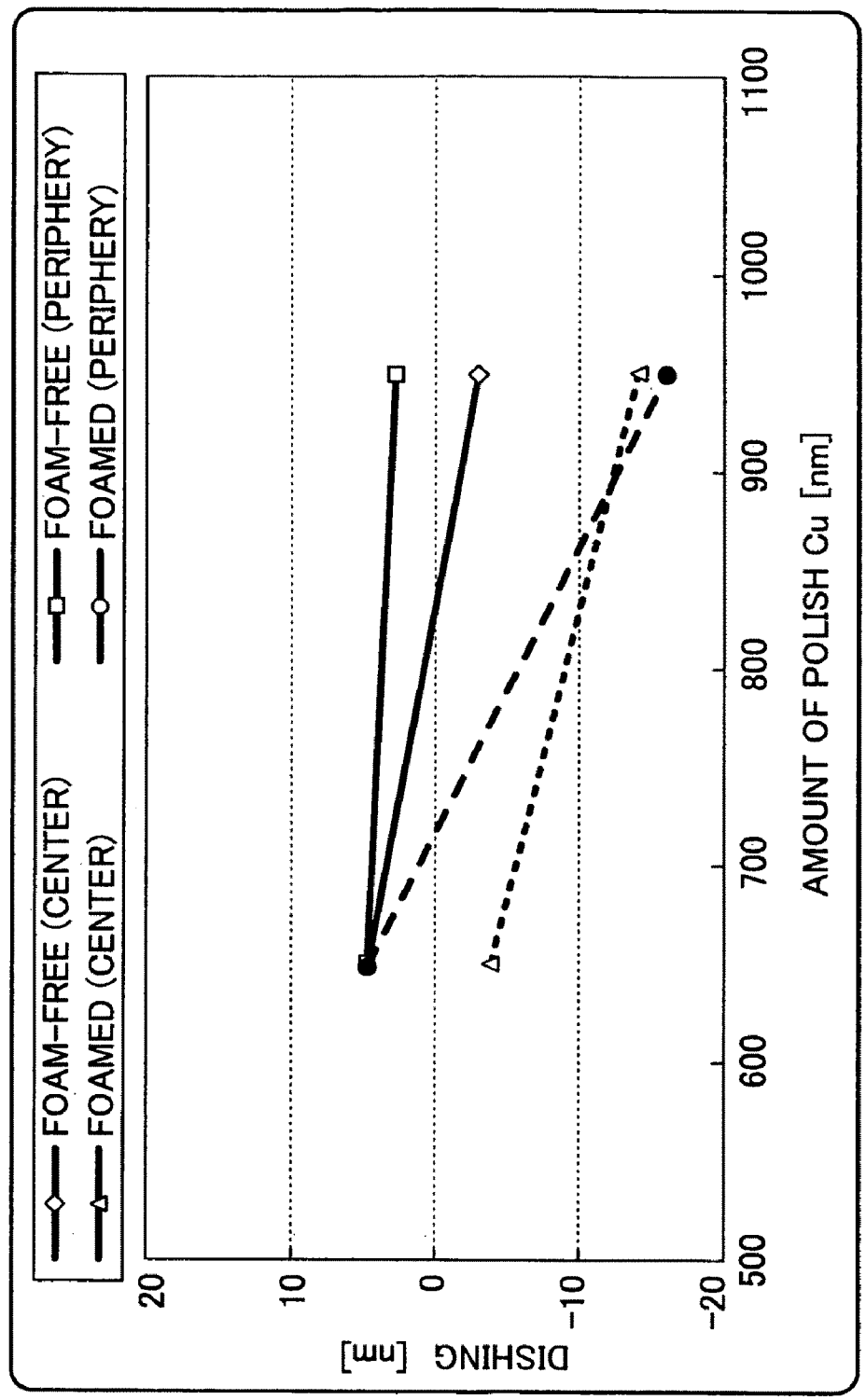
FIG. 24 is a diagram showing the effect of planarization processing achieved by the present invention in comparison with a conventional case.

FIG. 24 shows the result of the comparison.

In the specimen used with the experiment, the magnitude of the level difference or dishing defined in FIG. 23 was 130-140 nm before the polishing experiment. After the polishing applied to such a structure with the duration equivalent to the duration of polishing the test specimen not formed with the damascene structure to the depth of 650 nm, no substantial difference at the substrate central part between the case in which the polishing pad of foaming structure is used and the case in which the polishing pad of foam-free structure is used. However, in the case the polishing pad of foaming structure has been used, it can be seen that there is caused a dishing of about −5 nm in the peripheral part of the substrate. This means that there is caused slight subsiding in the region of the interconnection pattern as a result of erosion.

Contrary to this, in the case polishing is made with the duration corresponding to the depth of 950 nm in specimen for polishing rate measurement, it can be seen that subsiding reaching 15 nm is caused not only in the peripheral part but also in the central part of the substrate when the polishing pad of foaming structure has been used, and no flat polishing surface is obtained.

Contrary to this, in the case a polishing pad of foam-free structure is used, it can be seen that the amount of subsiding is decreased significantly both in the central part and peripheral part of the substrate.

In this way, subsiding of the polishing surface by erosion at the time of chemical mechanical polishing of a metal film is suppressed effectively with the present embodiment, and it becomes possible to realize planarization of the interconnection layer polished by chemical mechanical polishing at the time of formation of the multilayer interconnection structure.

Figure 25:
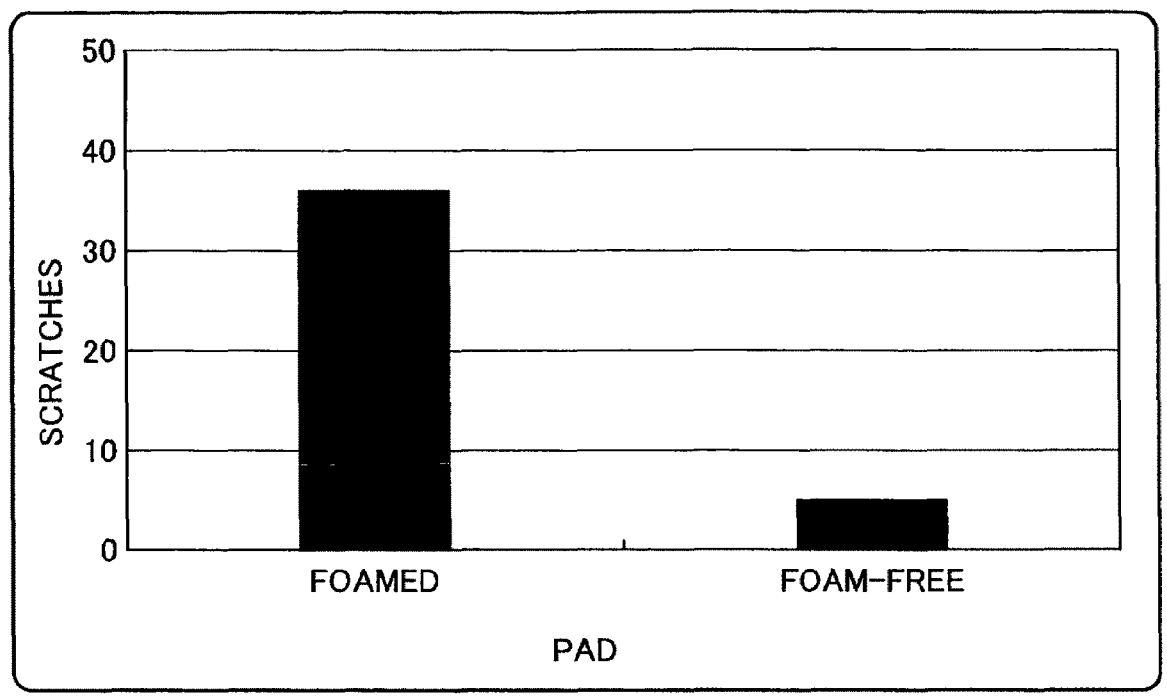
FIG. 25 is a diagram showing the number of defects in the planarization surface obtained by the present invention in comparison with conventional case.

FIG. 25 shows the result of investigation with regard to the number of scratches caused in the damascene interconnection structure corresponding to FIG. 1E formed by using the polishing pad of foam-free structure and the polishing pad of foaming structure. In this experiment, the Cu layer 23 is subjected to chemical mechanical polishing process for two minutes in the step of FIG. 1E and be polishing the chemistry machine for 2 minutes.

Referring to FIG. 25, it can be seen that in the case that the polishing pad of foam-free structure is used, the number of scratches, and hence the number of defects, seen on the substrate surface is decreased to $\frac{1}{7}$ of the case in which the polishing pad of the foaming structure is used.

Meanwhile, it should be noted that the result of FIG. 25 is for the case in which the proportion of the abrasive particles contained in the slurry is set to the 1.0 wt % as shown in Table 1 previously.

On the other hand, when the proportion of the abrasive particles in the slurry has increased in the case of polishing a substrate surface carrying thereon projections and depressions, the polishing pad makes contact with the convex structure when the polishing pad of foam-free structure is used, resulting in formation of gap between the concave structure and the polishing pad. Thereby, the abrasive particles penetrated to such a gap may cause polishing also in such a concave structure in addition to the convex structure, resulting in overall subsiding of the polishing surface.

This problem becomes conspicuous when the concentration of the abrasive particles in the slurry has exceeded 3 wt %, and when the concentration of the abrasive particles has reached 5-6 wt %, it was discovered that there occurs subsiding of polishing surface similar to the case of using the polishing pad of foaming structure occurs in spite of the fact of using the polishing pad of foam-free structure.

From this, it is concluded that it is desirable, when carrying out chemical mechanical polishing by using a polishing pad of foam-free structure, to set the proportion of the abrasive particles in the slurry to 3 wt % or less, preferably 1 wt % or less. Further, it should be noted that the chemical mechanical polishing of the present invention proceeds even in the case the concentration of the abrasive particles in the slurry is 0% and hence no abrasive particles are added to the slurry, depending on the surface state of the polishing pad.

In the chemical mechanical polishing process of the present embodiment explained before, it should be noted that the surface temperature of the polishing pad is controlled also.

Generally, with the CMP apparatus shown in FIG. 2, a temperature control unit is incorporated into the polishing platen 11, and thus, the surface temperature of the polishing pad is controlled to the range of below 5° C. or more but not exceeding 40° C. in the previous experiment by using such a temperature control unit. In the polishing of a metal film conducted by using a polishing pad of foam-free structure, it has been discovered that the range of 10 to 30° C. is especially preferable.

When the surface temperature of the polishing pad is too low and has decreased below 0° C., for example, there is a possibility that the pure water used in the slurry causes freezing. When this occurs, there is a concern that the ice particles dropped on the polishing pad cause scratching. Further, there are substances used in the slurry that are sensitive to the temperature. For example, when the temperature has increased excessively, the reaction rate rises excessively and the etching reaction may become too strong. Thereby, planarization of the polishing surface is deteriorated.

While the foregoing explanation has been made for the case of polishing a metal film such as Cu by a chemical mechanical polishing process, the chemical mechanical polishing process of the present invention that uses a polishing pad of foam-free structure is effective also in the case of planarization of the insulation films.

For example, the present invention can be used for polishing an oxide film filling a device isolation trench in the process of formation of an STI (shallow trench isolation) structure. It should be noted that the present invention, which uses a polishing pad of foam-free structure, is especially effective in chemical mechanical polishing of an oxide film conducted by using the slurry that contains ceria as abrasive particles.

It should be noted that the slurry that contains ceria as abrasive particles also contains an agent acting as surfactant and further having the function of forming protective film, similarly to the slurry applied to Cu, wherein such a protective film formation agent performs the function of impeding further progress of polishing by adhering to the surface of the nitride film surface formed under the oxide film, contrary to the case of polishing of Cu.

The present invention is effective also in such planarization of insulation films such as chemical mechanical polishing of an STI structure.

Fifth Embodiment

Figure 26:
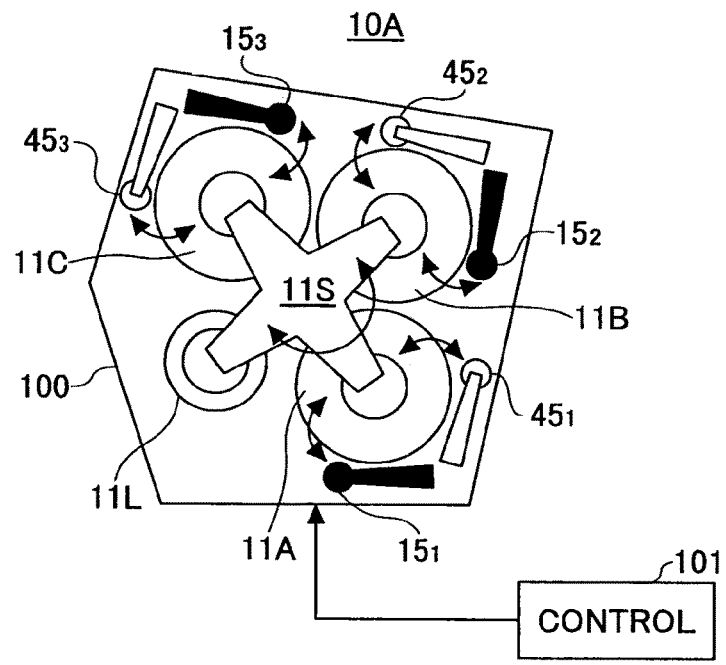
FIG. 26 is a diagram showing the construction of a CMP apparatus according to a fifth embodiment of the present invention.

FIG. 26 shows the construction of a CMP apparatus 10A according to a fifth embodiment of the present invention that adapted to implement the fourth embodiment of the present invention.

In the previous embodiment of the present invention, conditioning has been conducted by using at least two conditioning disks of different surface states at the time of using a polishing pad of foam-free structure for retaining the slurry stably on the polishing pad surface.

Now, when such two different conditionings are to be performed with the CMP apparatus 10 of FIG. 2, there is a need of changing the conditioning disk 15 by hand work, while this is unrealistic in the production line of semiconductor devices.

FIG. 26, on the other hand, shows a CMP apparatus 10A adapted to the production line wherein it will be noted that, with the CMP apparatus 10A, there are provided three polishing platens 11A-11C on main body 100 of the CMP apparatus so as to enable polishing with different slurries, wherein there is further provided a spindle 11S rotatably so as to enable exchange of the substrates to be processed between the three polishing platens 11A-11C.

Thus, the spindle 11S picks up one substrate to be processed from a load cup 11L and urges the substrate to any of the polishing platens 11A-11C on which polishing pad of foam-free structure is mounted it, while rotating the substrate. Thus, the spindle 11S is equivalent of the substrate carriers 13 in the CMP apparatus of FIG. 2.

Furthermore, the CMP apparatus 10A is provided with a conditioner carrying conditioning disks $15_1$-$15_3$ in the tip of movable arms corresponding to the respective polishing platens 11A-11C. By urging the conditioning disk to a corresponding polishing platen, conditioning of the polishing pad mounted on the polishing platen is achieved. With the CMP apparatus 10A, it should be noted that such conditioning can be achieved easily by merely swinging the arm of the conditioner.

Thereby, in order that the two different conditionings shown in FIGS. 5A and 5B previously are achieved by the two conditioning disks, there is provided a different conditioner with the CMP apparatus 10A such that the different conditioner includes movable arms carries respective, different conditioning disks $45_1$-$45_3$ at the respective tip ends thereof in correspondence to the polishing pads 11A-11C. Thereby, it should be noted that the conditioning by the conditioning disks $45_1$-$45_3$ can be achieved by merely swinging each arm.

Further, with the CMP apparatus 10A of FIG. 26, there is provided a control unit 101 controlling the polishing platens 11A-11C, spindle 11S, conditioning disks 15A-15C and also the conditioning disks 45A-45C.

Figure 27:
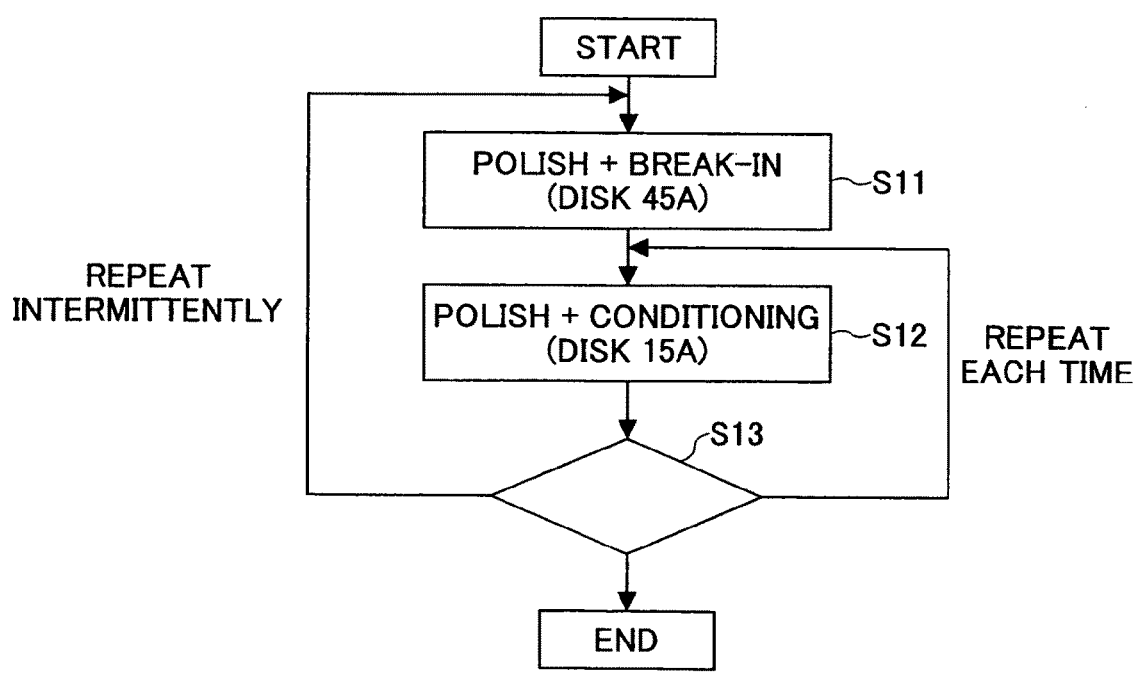
FIG. 27 is a flowchart showing an example of polishing process carried out by using the CMP apparatus of FIG. 26.

FIG. 27 is a diagram showing the control sequence of the CMP apparatus 10A by the control unit 101 of FIG. 26.

Referring to FIG. 27, polishing is made on the platen 11A, and in the step 11, a new polishing pad of foam-free structure on the polishing platen 11A is subjected to conditioning (break-in) with the coarse conditioning disk $45_1$.

Further, in the step 12, polishing of the substrate is conducted repeatedly to a predetermined period while conditioning the surface of the polishing pad of foam-free structure by using the fine conditioning disk $15_1$. When the total time of conditioning has reached a predetermined period, the break-in of the step 11 is implemented again based on the determination in the step 13. Thereby, switching between the conditioning disks $15_1$ and $45_1$ is controlled by the control unit 101.

Further, in the step 12, the conditioning of the polishing pad of foam-free structure by the conditioning disk 15A may be achieved concurrently to the polishing of the substrate to be processed or separately before the polishing of the substrate to be processed.

Figure 28:
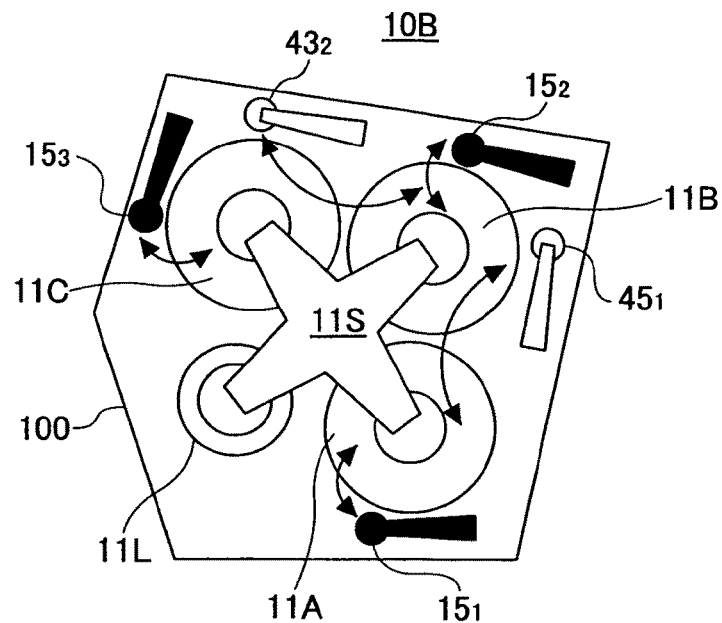
FIG. 28 is a diagram showing a modification of the CMP apparatus of FIG. 26.

FIG. 28 shows the construction of the CMP apparatus 10B according to a modification of the CMP apparatus 10A of the FIG. 26, wherein those parts corresponding to the parts explained with reference to FIG. 26 are designated by the same reference numerals and the description thereof will be omitted.

With the construction of FIG. 26, the conditioner carrying the conditioning disk $15_1$ and the conditioner carrying the conditioning disk $45_1$ are provided only for polishing platen 11A, the conditioner carrying the conditioning disk $15_2$ and the conditioner carrying the conditioning disk $45_2$ are provided only for polishing platen 11B, and the conditioner carrying the conditioning disk $15_3$ and the conditioner carrying the conditioning disk $45_3$ are provided only for polishing platen 11C, while in the present embodiment shown in FIG. 28, the conditioner of FIG. 26 that carries the conditioning disk $45_3$ is omitted, and instead, the arm of the conditioner carrying the conditioning disk $45_3$ is constructed so as to swing between the polishing platens 11A and 11B. Similarly, the arm of the conditioner that carries the conditioning disk 45B is constructed so as to swing between the polishing platens 11B and 11C.

Thus, with the construction of FIG. 28, the conditioning disk $45_1$ is shared between the polishing platens 11A and 11B, and the conditioning disk $45_2$ is shared between the polishing platens 11B and 11C.

According to such a construction, it is possible to simplify the construction of the CMP apparatus 10B.

Figure 29:
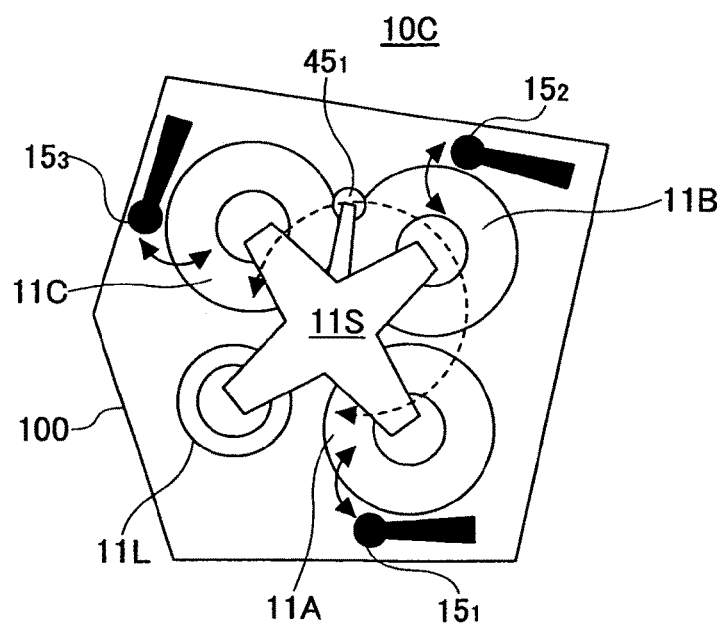
FIG. 29 is a diagram showing a different modification of the CMP apparatus of FIG. 26.

FIG. 29 shows the construction of a CMP apparatus 10C according to a modification of the CMP apparatus 10A of FIG. 26, wherein those parts corresponding to the parts explained with reference to FIG. 26 are designated by the same reference numerals and the description there of will be omitted.

Referring to FIG. 29, the conditioner carrying the conditioning disks $45_2$ and $45_3$ of the construction of FIG. 26 is eliminated with the present embodiment, and the conditioner carrying the conditioning disk $45_1$ is provided so as to swing coaxially with the spindle 11S.

With this, it becomes possible to share the single conditioning disk $45_1$ between the polishing platens 11A-11C, and it becomes possible to simplify the construction of the CMP apparatus.

Sixth Embodiment

Figure 30:
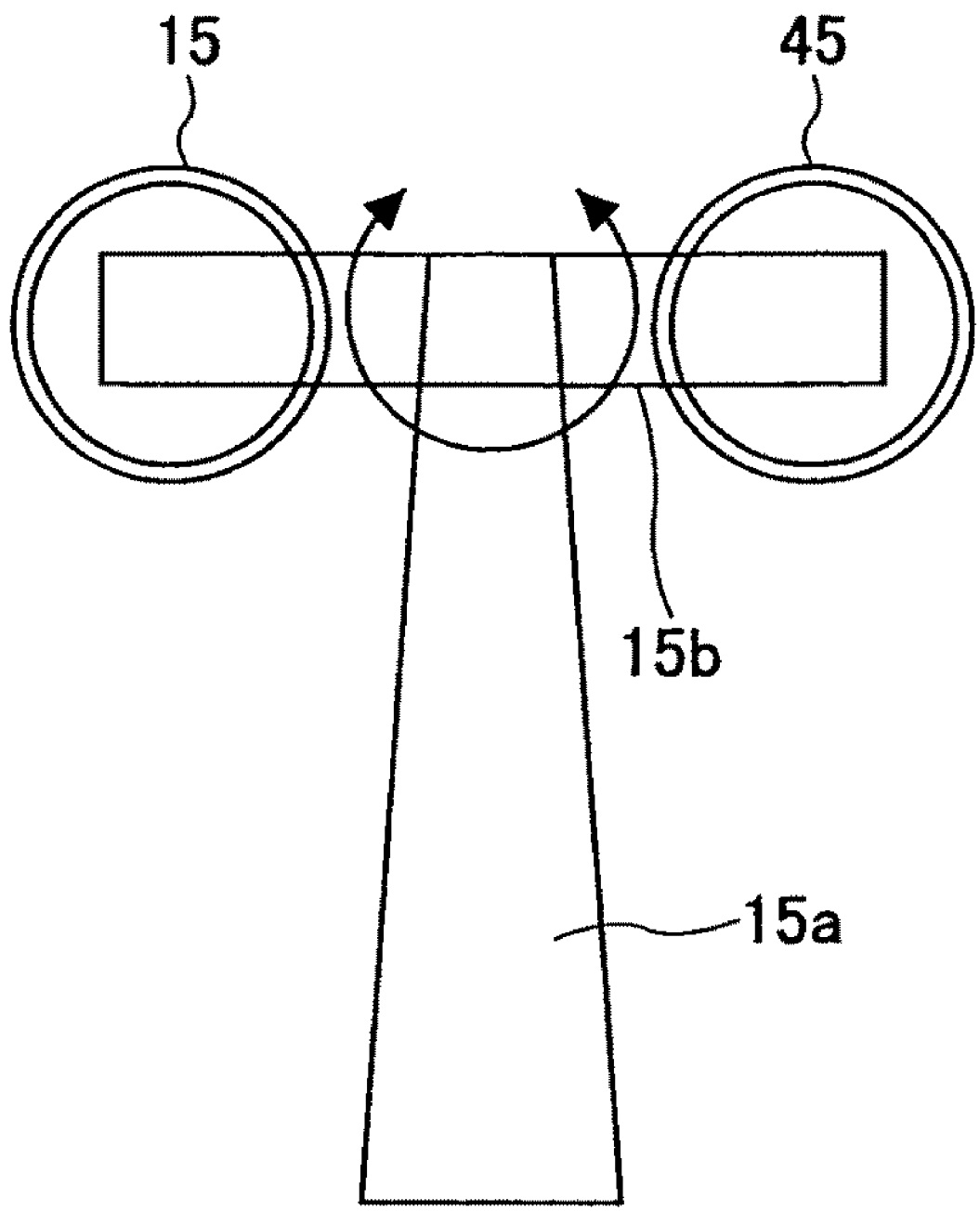
FIG. 30 is a diagram showing the construction of a conditioner according to a sixth embodiment of the present invention.

FIG. 30 shows the construction of a conditioner that enabling two, different conditionings with the CMP apparatus 10 of FIG. 2.

Referring to FIG. 30, there is provided an additional conditioning disk 45 on the tip end of an arm 15a that carries the conditioning disk 15 with the present embodiment, wherein the conditioning disk 15 and the conditioning disk 45 are held on a different arm 15b that was attached to the tip end of the arm 15a rotatably.

Thus, by rotating the arm 15b at the tip end of the arm 15a, it becomes possible to change the conditioning disk between disk 15 and disk 45 when conditioning the polishing pad 12.

According to the construction, it becomes possible to perform two, different conditionings with the conventional CMP apparatus 10 without changing the fundamental construction thereof.

Further, the present invention is not limited to production of semiconductor devices but is applicable also for polishing optic components such as lens or magnetic disks.

Further, the present invention is not limited to the embodiments described heretofore, but various variations and modifications may be made without departing from the scope of the invention.

What is claimed is:

1. A polishing apparatus, comprising:
   a polishing platen rotating and carrying a polishing pad thereon;
   a substrate carrier holding a substrate to be processed and urging said substrate to said polishing pad while rotating said substrate;
   a slurry supply mechanism supplying slurry to said polishing pad; and
   first and second conditioners each holding a conditioning disk for conditioning said polishing pad, said first and second conditioners urge said conditioning disks to said polishing pad while rotating said conditioning disks;
   wherein said first and second conditioners have thereon diamond abrasive grains, and a surface roughness of said first conditioner is different than a surface roughness of said second conditioner,
   wherein said polishing apparatus further includes a control unit, said control unit controlling said first and second conditioners, in said polishing platen, such that said polishing pad mounted upon said polishing platen is applied with conditioning repeatedly with said first conditioner during each time a substrate is polished and such that said polishing pad is applied with conditioning with said second conditioner intermittently when a total conditioning time of said first conditioner has reached a predetermined time.

2. The polishing apparatus as claimed in claim 1, wherein said polishing apparatus further includes a plurality of polishing platens.

3. The polishing apparatus as claimed in claim 2, wherein, said first conditioner cooperates with one of said polishing platens, and said second conditioner cooperates with a plurality of polishing platens.

4. The polishing apparatus as claimed in claim 1, wherein each of said conditioners carries a plurality of conditioning disks.

5. A polishing apparatus, comprising:
   one or more polishing platens rotated and carrying respective polishing pads thereon;
   one or more substrate carriers for holding respective substrates to be processed, each of said one or more substrate carriers urging a substrate held thereon to a corresponding polishing pad while rotating said substrate;
   a slurry supply mechanism for supplying slurry to said one or more polishing pads, and
   at least two conditioners cooperating with each of said one or more polishing pads, said at least two conditioners holding respective conditioning disks for conditioning said cooperating polishing pad, said at least two conditioners urging said respective conditioning disks to said cooperating polishing pad while rotating said conditioning disks,
   wherein said at least two conditioners have thereon diamond abrasive grains, said at least two conditioners individually being a first type or a second type, and a surface roughness of said conditioner of the first type is different than a surface roughness of said conditioner of the second type, and
   wherein each of said one or more polishing pads is conditioned by a cooperating conditioner of the first type and a cooperating conditioner of the second type,
   said polishing apparatus further including a control unit, said control unit controlling said at least two conditioners, in each of said one or more polishing platens, such that a polishing pad mounted upon said polishing platen is applied with conditioning repeatedly with said conditioner of said first type during each time a substrate is polished and such that said polishing pad is applied with conditioning with said conditioner of said second type intermittently when a total conditioning time of said first conditioner has reached a predetermined time.

6. The polishing apparatus as claimed in claim 5, wherein each of said one or more polishing platens has two corresponding conditioners.

7. The polishing apparatus as claimed in claim 5, wherein one of said at least two conditioners cooperates with one or more polishing platens.

8. The polishing apparatus as claimed in claim 5, wherein said one or more polishing platens have a corresponding conditioner of the first type, and
wherein said conditioner of the second type cooperates with more than one polishing platen.

9. The polishing apparatus as claimed in claim 5, wherein each of said at least two conditioners carries a plurality of conditioning disks.

* * * * *